US006999907B2

(12) United States Patent  
Smith

(10) Patent No.: US 6,999,907 B2  
(45) Date of Patent: Feb. 14, 2006

(54) SYSTEM AND PROCESS FOR CLIENT-DRIVEN AUTOMATED COMPUTER-AIDED DRAFTING

(75) Inventor: Terrance W. Smith, Edmonton (CA)

(73) Assignee: Draftlogic System, Inc., Alberta (CA)

( * ) Notice: Subject to any disclaimer, the term of this patent is extended or adjusted under 35 U.S.C. 154(b) by 1039 days.

(21) Appl. No.: 09/960,467

(22) Filed: Sep. 19, 2001

(65) Prior Publication Data

US 2002/0035408 A1 Mar. 21, 2002

Related U.S. Application Data

(60) Provisional application No. 60/233,472, filed on Sep. 19, 2000.

(51) Int. Cl.  
*G06F 17/50* (2006.01)

(52) U.S. Cl. .............................. 703/1; 703/22; 715/502

(58) Field of Classification Search ..................... 703/1, 703/22; 705/53, 412; 715/853, 502; 345/441; 706/50  
See application file for complete search history.

(56) References Cited

U.S. PATENT DOCUMENTS

| 4,885,694 | A | | 12/1989 | Pray et al. ............. 364/464.01 |
| 4,912,657 | A | * | 3/1990 | Saxton et al. ................ 715/853 |
| 4,922,432 | A | | 5/1990 | Kobayashi et al. ......... 364/490 |
| 4,964,060 | A | | 10/1990 | Hartsog ....................... 364/512 |
| 5,444,843 | A | | 8/1995 | Nilsson et al. .............. 395/161 |
| 5,646,992 | A | * | 7/1997 | Subler et al. .................. 705/53 |
| 5,903,886 | A | | 5/1999 | Heimlich et al. ............. 706/50 |
| 5,930,779 | A | * | 7/1999 | Knoblock et al. .......... 705/412 |
| 6,134,338 | A | * | 10/2000 | Solberg et al. ............. 382/113 |
| 6,232,985 | B1 | | 5/2001 | Chase et al. |

FOREIGN PATENT DOCUMENTS

| GB | 1 432 615 | 4/1976 |
| JP | 08-180082 | 7/1996 |
| JP | 00035990 | 2/2000 |

OTHER PUBLICATIONS

Koutamanis et al., A. Automated recognition of architectural drawings, IEEE, 11th IAPR Int. Conference on Pattern Recognition, Aug.-Sep. 1992, pp. 660-663.*

Valveny et al., E. Application of deformabletemplate matching to symbol recognition in hand-written architectural drawings, IEEE, Proceedings of the 5th Int. Conference on Document Analysis ad Recognition, Sep. 1999, pp. 483-486.*

Ah-Soon et al., C. Variations on the analysis of architectural drawings, IEEE, Proceedings of the 4th Int. Conference on Document Analysis and Recognition, Aug. 1997, pp. 347-351.*

(Continued)

*Primary Examiner*—Russell Frejd  
(74) *Attorney, Agent, or Firm*—Sheridan Ross P.C.

(57) ABSTRACT

A process comprising identifying assets in a raw architectural CAD drawing, applying compliance and preferred criteria for creating detailed engineering specifications corresponding to said assets and producing detailed engineering CAD drawings and reports. Preferably, one or more preferred databases of criteria augment the criteria needed for compliance with local codes, said preferred databases including architecturally specific criteria and a client's professional, individual and preferred criteria. Repeated use results in ever more complete databases of preferred criteria for enabling a process requiring little or no additional intervention for processing subsequent CAD drawings. Apparatus embodying the process preferably include a computer and an interactive network system and having at least one client terminal for interacting with a client, downloading the client's raw CAD files and uploading detailed output CAD drawings to the client.

27 Claims, 22 Drawing Sheets

OTHER PUBLICATIONS

Dosch et al., P. Reconstruction of the 3D structure of a building from the 2D drawings of its floors, IEEE, Proceedings of the 5th Int. Conference on Document Analysis and Recognition, Sep. 1999, pp. 487-490.*

Huang et al., M. Interpreting images of architectural drawings for building cost estimation, IEEE 6th Int. Conference on Image Processing and Its Applications, Jul. 1997, pp. 126-130.*

Llados et al., J. Hand drawn document understanding using the straight line Hough transform and graph matching, IEEE, 13$^{th}$ Int. Conference on Pattern Recognition, Aug. 1996, pp. 497-501.*

Pasternak et al., B. Adaptable drawing interpretation using object-oriented and constraint-based graphic specification, IEEE, Proceedings of the 2$^{nd}$ Int. Conference on Document Analysis and Recognition, Oct. 1993, pp. 359-364.*

Robinson Engineering, Inc., *Introduction to Design Master*, no date given, pp. 1-7 to B25.

(No author), *Knowledge-based Engineering and The ICAD System*, Release 7.0.

Schlueter, Georg J., Ph.D., et al., *System Applications in Highly Automated Engineering Environments*, Integration Partners, Inc., downloaded Sep. 14, 2001, available at www.integrationpartners.com,.

Buzzsaw, Inc., Products and Services Overview Page, downloaded Sep. 13, 2001, available at www.buzzsaw.com, Copyright 1999-2001, Buzzsaw, Inc.

IntelCAD Systems, Product Overview of IntelCAD-RC, downloaded Sep. 13, 200, availalbe at www.intelcad.com, Copyright 1999-2001 IntelCAD Systems.

Goulette, F., *Automatic CAD Modeling of Industrial Pipes from Range Images*, Proceedings of the International Conference on Recent Advances in 3-D Digital Imaging and Modeling, downloaded Sep. 13, 2001, available at www.computer.org, Copyright 1997, Instititute of Electrical and Electronics Engineers, Inc.

Knowledge Technologies International, product overview of the ICAD System, downloaded Sep. 13, 2001, available at www.ktiworld.com, Copyright 2001 Knowledge Technologies International.

Lipson, et al., *Towards a Universal Knowledge Database for Design Automation*, Proceedings of ICAD2000 First International Conference on Axiomatic Design, Jun. 21-23, 2000.

Ning, Y., et al., *A Method for Data Transfer from CAD to Estimating System*, Information Processing in Civil and Structural Engineering Design, Aug. 14, 1996, pp. 115-118, CIVIL-COMP Ltd., Edinburgh, Scotland.

Sauce, et al., *A Knowledge-Based System for Construction-Site Organization*, Microcomputers in Civil Engineering, 1995, vol. 10, pp. 187-197, Blackwell Publishers, Cambridge, Massachusetts.

Johansson, Olof, *Using an Extended ER-Model Based Data Dictionary to Automatically Generate Product Modeling Systems*, Jun. 21, 1994, Department of Computer and Information Science, Linköping University, Sweden.

Lewis, et al., *Generation of 3D Building Models from 2D Architectural Plans*, Computer-Aided Design, vol. 20, No. 10, pp. 765-779, 1998.

* cited by examiner

| Room | Config | | Qty | Amp |
|---|---|---|---|---|
| CLASSROOM | Duplex | | 6 | 15 |
| CORRIDOR | Duplex | | 6 | 15 |
| ELECT | Duplex | | 6 | 15 |
| EOFFICE | Duplex | | 6 | 15 |
| GOFFICE | Duplex | | 6 | 15 |
| JANITOR | Duplex | | 6 | 15 |
| LIBRARY | Duplex | | 6 | 15 |
| LOUNGE | Duplex | | 6 | 15 |
| MECH | Duplex | | 6 | 15 |
| METER | Duplex | | 6 | 15 |
| STORAGE | Duplex | | 6 | 15 |
| VESTIBLE | Duplex | | 6 | 15 |
| WASHROOM | Duplex | | 6 | 15 |
| WORKROOM | Duplex | | 6 | 15 |

Dropdown options:
- Duplex
- Split
- Half-switched
- Double duplex
- Isolated ground duplex
- Duplex above countertop
- Split above countertop Configuration ⊟ Configuration
    I want to work on:
       ⦿ Full Floor Plan
       ○ One room at a time Arrange my rules by:
       ⦿ System
       ○ Room

⊟ Rule Choices for System
    ⊟ Auxilliary Systems
        ⊟ Provide electrical outlets according to <u>one</u> of the following rules.
            Number of outlets per circuit [6]
                ⊙ Provide one electrical outlet per [10]    linear feet of wall.
                ○ Provide one electrical outlet per [50]    square feet of space in the room After selecting the number of outlets for the room, the System will automatically locate them adjacent to desks, work stations and equipment. The balance will be evenly distributed on unused walls in the room.

⊞ Equipment
    ⊞ Exterior
    ⊟ GFI Outlet
        GFI outlets in washrooms - tie to [adjacent receptacle ▼]
    ⊞ Countertop Outlets
    ⊞ Computer Outlets
    ⊞ Corridors
    ⊟ Classrooms
        [5]    standard outlets per classroom
        [5]    standard outlets per circuit
        [1]    computer plug at [back ▼] of classroom
        [4]    standard outlets in [4]  corners of classroom
        [1]    standard outlets goes in the center of wall at [back ▼] of classroom
    ⊞ Electrical outlets adjacent to desks are to be:
    Telephone
    Television
    Fire Alarm
    Sound

Electrical Schedule

| | | | | | Electrical Panel Configuration | | | |
|---|---|---|---|---|---|---|---|---|
| 1-NAS-NA | DR | # | 723.906 | 1267.72 | 0 | 15 | 120/0.6 | ☐ |
| 1-NAS-NA | DR | # | 763.209 | 1262.72 | 0 | 15 | 120/0.6 | ☐ |
| 1-NAS-NA | DR | # | 811.898 | 1211.92 | 0 | 15 | 120/0.6 | ☐ |
| 1-NAS-NA | DR | # | 688.062 | 1267.72 | 0 | 15 | 120/0.6 | ☐ |
| 1-NAS-NA | DR | # | 669.417 | 1060.72 | 0 | 15 | 120/0.6 | ☐ |
| 1-NAS-NA | DR | # | 685.898 | 1017.49 | 0 | 15 | 120/0.6 | ☐ |

| | | | | | | | | |
|---|---|---|---|---|---|---|---|---|
| 1-1S-25 | DR | 105 | 750.898 | 1125.72 | 0 | 15 | 120/0.6 | ☐ |
| 1-1S-26 | DR | 107 | 759.898 | 1065.72 | 0 | 15 | 120/0.6 | ☐ |
| 1-1S-27 | DR | 119 | 824.898 | 1363.72 | 0 | 15 | 120/0.6 | ☐ |
| 1-1S-28 | DR | 122 | 683.898 | 444.721 | 0 | 15 | 120/0.6 | ☐ |
| 1-1S-28 | DR | 122 | 609.898 | 396.721 | 0 | 15 | 120/0.6 | ☐ |

Panel Schedule

| Circuit | φA | φB | φC | Breaker | V/C |
|---|---|---|---|---|---|
| 1-NAS-NA | X | | | NA | 120V |
| 1-1S-0 | X | | | 15 | 120V |
| 1-1S-1 | | X | | 15 | 120V |
| 1-1S-2 | | | X | 15 | 120V |
| 1-1S-3 | X | | | 15 | 120V |
| 1-1S-4 | | X | | 15 | 120V |

| | | | | | |
|---|---|---|---|---|---|
| 1-1S-26 | | | X | 15 | 120V |
| 1-1S-27 | X | | | 15 | 120V |
| 1-1S-28 | | X | | 15 | 120V |
| Load Totals | 150A | 150A | 135A | | |

Continue

Legend:

| ABBREVIATIONS-ID | DEFINITIONS |
|---|---|
| DR | Duplex Receptacle |

*Fig. 7*

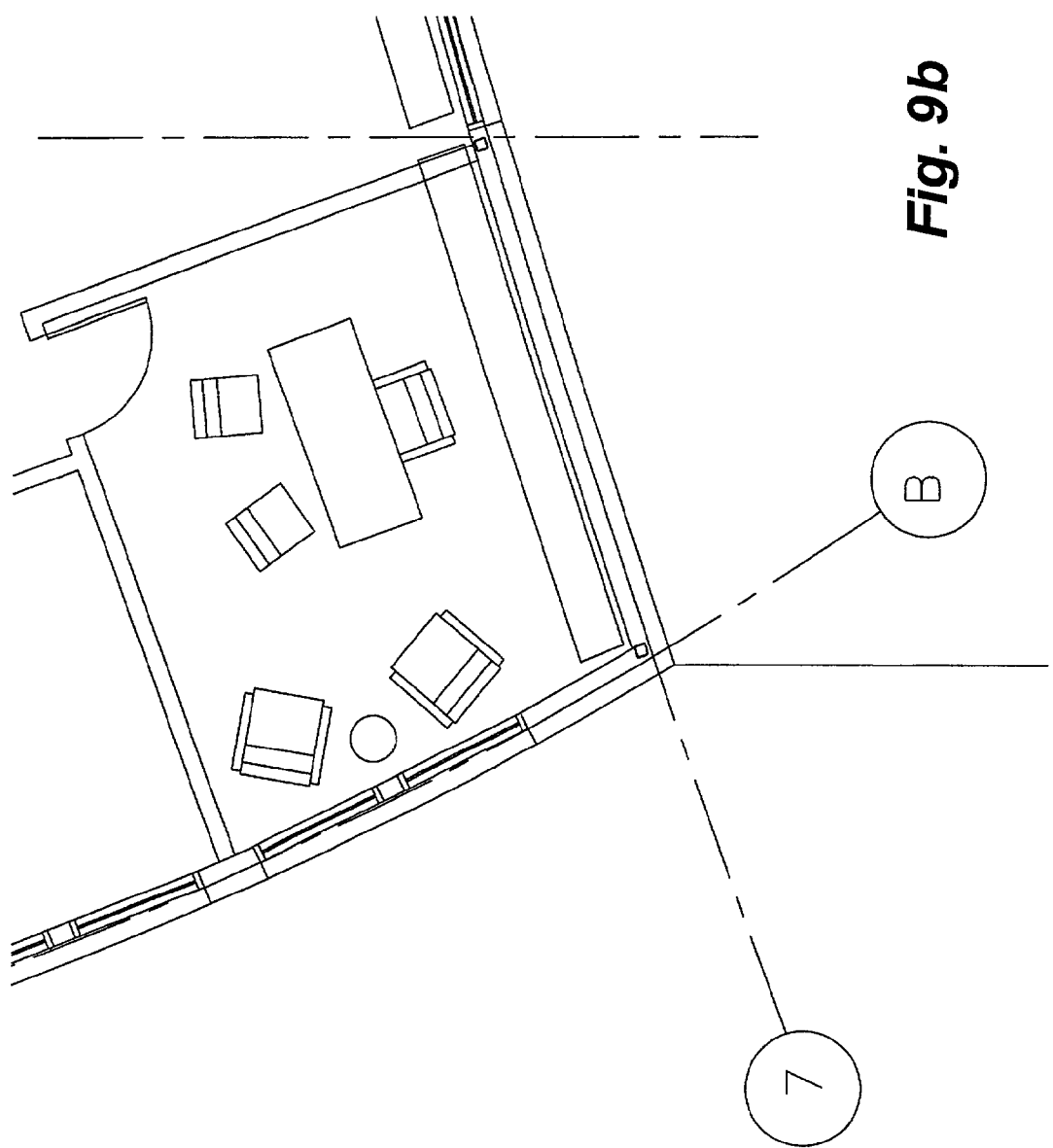

*Fig. 11a*

SECTION 16B - WORK AND MATERIALS

1.0 CONDUIT AND DUCT

1.1 Conduit in earth to be rigid metallic conduit with protective coating, rigid PVC or DBII encased in concrete where required.

1.2 Interior metal raceways to be of the EMT type except where within 1500mm of the finished floor and are subject to injury where same shall be rigid metallic conduit.

1.3 Electrical wiring and cables piercing fire separation walls shall be installed as per Section 3.1.9.3 of the 1998 edition of the Alberta Building Code.

2.0 BRANCH CIRCUIT WIRING

2.1 Branch circuit wiring to be copper 600 volt, minimum #12 AWG crosslink. No aluminum wiring will be permitted. Note that whenever wire sizes are not shown on the drawings, it is the Contractor's responsibility to ensure that the conductors satisfy C.E.C. Section 8-102 and the corresponding voltage drop tables.

2.2 Interior wiring shall be nonmetallic sheathed cable, metallic flexible cable, metallic conduit or combinations thereof as permitted by the Local Inspection Authority. It is the Contractor's responsibility to determine where NMD-7 may be utilized. No extras will be allowed for failure to do so.

2.3 Main feeders and panel feeders to be copper.

3.0 WIRING DEVICES

3.1 Lighting switches shall be white in color, spec. grade Decora series.

3.2 Duplex receptacles shall be white in color, spec. grade Decora series. 3-way, 4-way and 2-pole switches shall be of matching type.
Ground fault receptacles to be spec. grade Decora series. Surge suppression receptacle to be Hubbell #HBL5260S. Isolated ground receptacles to be spec. grade Decora series.

3.3 Range outlets to be Hubbell #9430 c/w #9432 angle cord cap.

3.4 Dryer outlets to be Hubbell #9430 c/w #9432 angle cord cap.

3.5 Shaver outlets to be Hubbell #G.F.52621.

3.6 Device plates shall be smooth white phenolic.

3.7 Weatherproof duplex receptacles to be c/w Leviton #4941 weatherproof covers.

3.8 All device outlet boxes to be of copper free, aluminum construction. No PVC FSE boxes shall be used.

4.0 MOUNTING HEIGHTS

4.1 Verify heights of all devices such as receptacles, switches, bracket lights, etc. with the Architect and/or Engineer before rough-in. In general, mounting heights shall be as follows, unless specified to the contrary on the drawings:

.1 Duplex receptacles    450mm
  .2 Switches    1200mm
  .3 Thermostats    1550mm
  .4 Telephone/Television outlets    450mm
  .5 Fire alarm pull stations    1500mm
  .6 Fire alarm bells    300mm below ceiling

DIVISION 16 – ELECTRICAL

SECTION 16A – GENERAL REQUIREMENTS

1.0 GENERAL

1.1 The General Conditions and instructions to Bidders as set forth in the general contract specifications and all addenda thereto shall apply to, and govern all portions of the electrical work.

1.2 Points not specifically mentioned shall be in strict accordance with the Canadian Electrical Code and regulations of the Electrical Inspection Department from which the permit was obtained. The latest revisions and/or amendments to the Code, with applicable date restrictions, shall also govern work on this contract.

1.3 It is the intent that these drawings and specifications provide for an electrical installation complete and in operating condition. The Contractor shall be responsible for supplying and installing all material necessary to accomplish this, except where specifically noted that such work or material is not included.

2.0 CODES, PERMITS AND INSPECTIONS

2.1 The installation shall comply with the requirements of the current edition of the Canadian Electrical Code and the regulations of the Electrical Inspection Department having jurisdiction.

2.2 Electrical trade shall obtain all electrical permits required and after completion of the work shall furnish to the Architect a Certificate of Final Inspection and Approval from the Inspection Department. Electrical trade shall take out all permits at the beginning of the work.

2.3 The Electrical Contractor shall specifically note that he shall submit two (2) sets of drawings to the Electrical Inspection Department and shall include all costs for prints, survey, etc. in this electrical tender.

2.4 The Electrical Contractor shall include in his electrical tender Edmonton Power's Plan Review charges.

3.0 STANDARDS OF WORKMANSHIP AND MATERIAL

3.1 All material supplied by the Contractor shall be new and of the quality specified. All such material shall conform to the standards of the Canadian Standards Association, and shall bear the necessary CSA label. For any material not CSA approved, this Contractor shall obtain the approval of the Local Inspection Authority, and shall bear all inspection charges levied and any modification costs required.

3.2 All phases of the electrical installation shall be executed in a satisfactory, workmanlike manner, and shall present a neat mechanical appearance when completed. Work not considered satisfactory to the Engineer shall be corrected at the Contractor's expense.

MECHANICAL SPECIFICATIONS

1.0 INTENT 1.1 IT IS TO PROVIDE FOR A COMPLETELY AND FULLY OPERATING MECHANICAL SYSTEM IN COMPLETE ACCORD WITH ALL APPLICABLE CODE AND ACCEPTED STANDARDS. THE SPECIFICATION MAY NOT COVER EACH AND EVERY ITEM REQUIRED FOR THE COMPLETE MECHANICAL INSTALLATION, THEREFORE, THE MECHANICAL CONTRACTOR SHALL MAKE HIS OWN PROVISIONS FOR ALL LABOR MATERIAL AND EQUIPMENT DEEMED NECESSARY TO COMPLETE THE MECHANICAL SYSTEM.

2.0 CERTIFICATES, FEES, ETC.

2.1 GIVE ALL NOTICES, OBTAIN ALL PERMITS AND PAY ALL FEES SO THAT THE WORK SPECIFIED HEREIN MAY BE CARRIED OUT. HE SHALL FURNISH ANY CERTIFICATES, AT THE PRIME CONSULTANT'S REQUEST, AS EVIDENCE THAT THE WORK INSTALLED CONFORMS WITH THE LAWS AND REGULATIONS FOR ALL AUTHORITIES HAVING JURISDICTION.

3.0 CUTTING AND PATCHING 3.1 THE MECHANICAL CONTRACTOR SHALL CONFER WITH THE GENERAL CONTRACTOR IN REGARD TO THIS WORK AND SHALL GIVE LOCATIONS FOR ALL HOLES FOR PIPES, DUCTS, ETC., AND PROVIDE SLEEVES REQUIRED TO EXECUTE THE MECHANICAL INSTALLATION.

4.0 EXCAVATION AND BACKFILLING 4.1 ALL EXCAVATION SHALL BE DONE BY THE MECHANICAL CONTRACTOR. THE MECHANICAL CONTRACTOR SHALL BACKFILL WITH SAND OR OTHER APPROVED MATERIAL TO A MINIMUM OF 12" OVER ALL PIPING OR AS NECESSARY TO PROTECT HIS WORK. THE GENERAL CONTRACTOR SHALL COMPLETE THE REMAINDER OF ALL BACKFILLING REQUIRED.

5.0 TESTING 5.1 TEST ALL EQUIPMENT AND MATERIAL WHERE REQUIRED BY SPECIFICATIONS OF AUTHORITY HAVING JURISDICTION TO DEMONSTRATE ITS' PROPER OPERATION TO THE OWNER'S REPRESENTATIVE. TEST PROCEDURES SHALL BE IN ACCORDANCE WITH APPLICABLE PORTIONS OF ASME, ASHRAE AND OTHER RECOGNIZED TEST REQUIREMENTS AS FAR AS FIELD CONDITIONS PERMIT.

5.2 PERFORM THE FOLLOWING TESTS AND UPON COMPLETION OF THE MECHANICAL INSTALLATION, TURN OVER TO THE OWNER THROUGH THE INSPECTOR ON SITE, A CERTIFICATION OF THE FOLLOWING TESTS WITH THE DETAILED DATA AS REQUIRED BY EACH. EACH TEST SHALL BE ITEMIZED AS TO TIME THE TEST WAS PERFORMED AND PERSONNEL RESPONSIBLE FOR A PERIOD OF EIGHT (8) HOURS AND PRESSURE MAINTAINED WITH NO APPRECIABLE PRESSURE DROP. WHERE LEAKAGE OCCURS, REPAIRS SHALL BE MADE AND ENTIRE SYSTEM RE-TESTED. ALL TESTS ARE TO BE MADE BEFORE BACKFILLING AND/OR FURRING:

.1 DOMESTIC WATER PIPING SHALL BE TESTED AT 120 PSI WATER PRESSURE MEASURED AT THE LOW POINT OF THE SYSTEM.

*Fig. 12b*

ARCHITECTURAL DOCUMENT STANDARDS & REQUIREMENTS. ALL EXHAUST FANS FRACTIONAL HP 1P-120V MOTOR.

13.3 EXHAUST FANS: MAKES, MODELS, CFM'S, STATIC PRESSURES & SONES ON DRAWINGS. ALL UNITS FHP, 120V/1φ/2W & EACH UNIT TO BE SUPPLIED LUTRON 1500 WATT SLIDE ACTION SPEED CONTROLLER. ALTERNATE UNITS TO BE FULLY EQUIVALENT WITH SPECIFIED UNIT CFM'S, STATIC PRESSURES, SONE LEVELS AS MINIMUM REQUIREMENTS.

13.4 ELECTRIC HEATERS: MAKES, MODELS, KW RATINGS ON DRAWINGS. ALL UNITS 120V/1φ/2W FOR 1.5 KW & 208V/1φ/3W FOR 3KW & BE C/W INTEGRAL T'STAT.

13.5 R-1 RETURN AIR GRILLES: TITUS CORE 50 C/W 30MM BORDER AND INTEGRAL OPPOSED BLADE BALANCING DAMPER.

PLUMBING FIXTURE SPECIFICATIONS

NON-FREEZE HOSEBIBB: CHROME PLATED, KEY LOCKING, SURFACE MOUNTED C/W VALVE AT MINIMUM 300MM INSIDE BUILDING, CRAME OR EMCO.

WC-1 WATER CLOSET

CRANE RADCLIFFE C/W ELONGATED BOWL, INSULATED TANK & OPEN FRONT SEAT & BUMPER. SEAT & BUMPER EQUAL TO OLSONITE 95CCSS.

LAV-1 SINGLE COMPARTMENT VANITY MOUNTED SINK

BOWL: CRANE CORONETTE SELF RIMMING, OVAL ENAMMELED STEEL SINGLE COMPARTMENT LAVATORY C/W GASKET & 4" DRILLINGS.

TRIM: CHICAGO FAUCET MODEL 1895 GOOSENECK FAUCET WITH 2-3/4" LEVER HANDLES, CHROME FINISH, PLUG & CHAIN.

SK-1 SINGLE COMPARTMENT STAINLESS STEEL SINK

BOWL: 18"X18.5"X7" O.D., 16"X14"X7" BOWL DIMENSIONS, SELF RIMMING, SINGLE COMPARTMENT WITH FAUCET LEDGE. MADE OF 20 GA. TYPE 316 STAINLESS STEEL. ARCHITECTURAL METAL INDUSTRIES MODEL 1009 C/W 4 HOLE DRILLING.

TRIM: CHICAGO FAUCET MODEL 1102 SWING SPOUT & 2-3/4" LEVER HANDLES & VEGETABLE SPRAY. INCLUDE SAN STUBOUT FOR DISHWASHER.

SK-2 MOP SINK & TRIM

BOWL: 24" X 24" MOULDED PLASTIC, FLOOR MTD, SELF RIMMING, SINGLE COMPARTMENT JANITORS SINK OF MOULDED PLASTIC CONSTRUCTION.
    FIAT MODEL MSB 2424 C/W FIAT HW & CW SUPPLIES, VACUUM BREAKER, MOP HANGER.

SYSTEM AND PROCESS FOR CLIENT-DRIVEN AUTOMATED COMPUTER-AIDED DRAFTING

CROSS REFERENCE TO RELATED APPLICATION

Priority is claimed from U.S. Provisional Patent Application Ser. No. 60/233,472, filed Sep. 19, 2000, entitled "SYSTEM FOR CLIENT-DRIVEN AUTOMATED COMPUTER AIDED DRAFTING", the disclosure of which is incorporated herein by reference in its entirety.

FIELD OF THE INVENTION

The invention relates to a system for receiving a raw drawing, implementing an adaptive rule-based process, and forming a detailed computer-aided-drafting (CAD) drawing, the content of which complies with regulatory and client criteria. More particularly, a remote client, through digital media, internet or other electronic communication supplies raw architectural drawings and receives detailed engineering drawings in return.

BACKGROUND OF THE INVENTION

In one context, a building design, in the form of architectural drawings (preliminary drawings), is provided to an engineer or design professional who applies codes, standards and rules to prepare and adjust the building design as necessary to ensure regulatory compliance and to meet the client's individual requirements. During this process, the design professional generates sufficient detail for the production of detailed engineering drawings and specifications suitable for construction including, for example, the location and type of electrical services and heating, ventilating and air conditioning (HVAC), all of which are subject to regulatory or higher design criteria. The detailed drawings are usually done by a team of skilled draftspersons, who may also be design professionals. These professionals also inject individuality and further detail into the final design.

An example of such a process is the generation of detailed mechanical and electrical drawings which include: specifications for supports, stud spacing and the position, number and capacity of electrical services, all of which are substantially compatible with a raw architectural preliminary layout specifying walls, doors, window layouts, and an elevation.

The drawing process, from architectural to detailed design drawings, is generally conducted along the following lines. Draftspersons start with a base plan, preferably extracted from an original raw architectural drawing. Alternatively, the draftsperson will draw the base plan from scratch. The designer, and more often a plurality of designers, reviews the specifications for the type of structure being designed. General specifications, including those required under the various codes for the jurisdiction, are gathered and applied including: providing a minimum wall insulation rating which sets minimum wall thickness, the form of electrical services which determines the size and locations of the motor control centers, and foundation backfill requirements including weeping tile and gravel filter requirements. The client's own specifications are consulted and applied for enhancing the design beyond those resulting from mere application of the general specifications. The application of the specifications is rendered into detailed design drawings.

Each preliminary and detailed drawing is comprised of vector elements typically created and placed using an input device, such as a digitizer manipulated by a draftsperson. For minimizing the labor involved in repetitively drawing consistent and known shapes, the elements themselves are usually provided as part of a predefined block or symbol or as a plug-in application provided with the CAD program. A draftsperson is still required to review the specification, choose the appropriate element and properly position the element in accordance with the known specifications and the individual professional's experience.

Further, individual clients or draftspersons are expected to distinguish a room from a corridor, and then define which of the various types of rooms receive which level of services (e.g. dedicated electrical outlets) and how the service will be supplied (e.g. through the floor or from the ceiling).

This known process, preliminary drawing through to detailed drawing, is laborious and inflexible. It is inevitable that there will be changes in the overall design which arise during the usually protracted duration between obtaining the preliminary drawings and final issuance of the detailed drawings. Further, the resulting level and quality of the details in the design is variable due to many levels of design input, from the design professional to the draftspersons. There is a need to repeatedly and dynamically revise each drawing, in a domino effect, for changes which arise in one or more related drawings.

About one half of the time expended, between obtaining the preliminary drawings and issuance of the detailed design drawings, is consumed in the detailed drafting portion. This creates two main disadvantages: a significant time delay, and a related increase in cost.

Further, while an architect, design professional or other client is constrained by many known and standardized codes, there are also instances where the known codes are inapplicable and personal judgment is applied or where the client's or design professional's personal standards exceed those of the codes. Each time the design process is commissioned, those personal and professional judgments or standards must be communicated to and be known by the draftsperson, generally through a working relationship developed over time, so that that appropriate standards and codes are utilized. Often the draftsperson simply adopts a number of personal and professional judgments or standards that are known, or which are assumed to be preferred by the design professional and those become the rules which are applied to the detailed design drawings.

Accordingly, there is identified a need for a system to aid the design professional, clients and client-engineers who wish to improve the detailed design process including to achieve the following: reduced turnaround, reduced costs, repeatedly and reliably applied personalized standards, and reduced overhead on the design professional where professional and standard codes are known and where individual professional standards can be learned and applied.

SUMMARY OF THE INVENTION

The present invention is a process for automating the determination of detailed engineering specifications and production of detailed engineering CAD drawings from a client's raw architectural drawings. Architectural drawings are not generally sufficiently detailed for one to develop a cost estimate, to direct the actions of a construction contractor, nor to establish compliance with mechanical and electrical standards, to name a few. Not only does an architectural drawing comprises a multitude of drawings elements but it also comprises assets formed of such drawings elements including corridors, rooms and utility rooms, all of which have different requirements for electrical and mechanical services, standards and compliance.

An architectural asset is more than merely geometrical characteristics such as a bounded area, or line dimension. Architectural assets also have functional characteristics. For example, two rooms having the same lineal wall length or area can have vastly different engineering specifications—for example compare a like-sized machine shop and a gymnasium. The number of choices necessary to assign the proper services and detail to an architectural drawing can be enormous. Such a task is normally indeterminate and requires repeated involvement of a design professional to bridge the gaps in most building standards.

The current system leads a client through a novel process of providing an architectural drawing, in a digital format, containing an architectural structure, parsing the drawing to locate the structure's determinative assets, applying standards applicable to at least the functional characteristics of the assets, and generating the detailed features necessary for production of detailed engineered drawings. Throughout, the client is encouraged to impose their professional and individual preferences on the design, these preferences being noted for future and repeated use. Defaults are provided which the client can override, including the clients own previous preferences. This is an ongoing learning process. Each project adds to the client's known professional preferences, ultimately resulting in a process requiring little or no additional intervention for subsequent projects, while still resulting in detailed designs that conforms to the client's personal and professional expectations. Moreover, by relying on a set of default standards, the system is sufficiently flexible and advantageous so that, in some instances, if a client wishes to obtain a quick and rough cost estimate, the system has the ability to generate detailed engineering drawings in a single pass through the process, with minimal intervention by the client.

Accordingly, the present invention accepts a client's preliminary architectural drawings and automates the production of detailed engineering drawings, specifications and reports which are sufficiently detailed for establishing compliance with known criteria. In a broad aspect, this process comprises the steps of:

reading one or more CAD files containing at least drawing elements forming one or more architectural assets;

parsing and labeling the one or more assets found within the one or more CAD files which have correspondence to labeled assets stored in an architectural assets database, the assets preferably being located in discrete drawing layers for ease of parsing;

retrieving compliance criteria from at least one compliance criteria database in which are stored compliance criteria corresponding to one or more of the labeled assets;

retrieving preferred criteria from at least one preferred criteria database in which are stored preferred criteria corresponding to one or more of the labeled assets;

applying the compliance and preferred criteria to the labeled assets for establishing detailed engineering specifications;

generating detailed drawing elements corresponding to the detailed engineering specifications; and writing at least the generated detailed drawing elements, to one or more output CAD files, and preferably also writing related reports.

Preferably, a computer is provided having means for reading, manipulating and writing CAD drawing elements and data files, and means for storing databases and performing operations thereon. More preferably, the process further comprises the steps of: maintaining an interactive network system and having at least one client terminal; downloading the client's raw CAD files from the client's terminal; and uploading detailed output CAD drawings to the client's terminal. It is advantageous also to maintaining one or more preferred criteria databases for the known client and then implementing a security and authentication process which ensures that the client's preferred criteria databases are only accessed by the known client.

The process is preferably recursive for enabling review of the detailed drawing elements and modification of the preferred criteria prior to outputting a CAD drawing and related reports.

These one or more databases are preferably located at the computer performing the manipulation. The database of compliance criteria comprises at least one database of general detailed design standards. The compliance database can also include specific design standards such as those detailing electrical or HVAC standards and default preferred criteria which exceed compliance criteria in some instances or provided further criteria where compliance criteria is non-existent or insufficiently detailed. The preferred criteria database comprises one or more databases of system default criteria or client preferred criteria which adds to, or exceeds the compliance criteria. Repeated use of the process by a client adds additional preferred criteria to that already stored in the preferred criteria database, eventually obviating a need for repeated interrogation by the system to fill in further criteria.

The raw architectural CAD drawing file usually includes, or is accompanied by, textual characteristics data so as to define a minimum number of drawing elements, features and characteristics. For increased functionality, the interactive network system provides a recursive interactive form which ensures a minimum of drawing elements, data and criteria are provided with each CAD drawing and process.

BRIEF DESCRIPTION OF THE DRAWINGS

FIG. 5 illustrates an interactive post-parsing form, including drop-down menus, for permitting changes to the default electrical specifications for the known structure and assets;

FIG. 6 illustrates a portion of an interactive form, including drop-down menus, which incorporates compliance, default and preferred criteria for review and modification by the client;

FIG. 7 is an exploded view of a resulting detailed electrical schedule which check boxes enabling addition or removal of the generated detailed features, complete with electrical load totals;

FIG. 9b is a closer view of the lower left corner of the plan view of FIG. 9a;

FIG. 10b is a closer view of the lower left corner of the plan view of FIG. 10a;

FIG. 11a is an example of the textual output reporting, in this case electrical specification annotations as applied to a detailed drawing accordingly to the General ES and Specific ES applied to the structure of FIGS. 9a–9b;

FIG. 11b is another example of the textual output reporting as applied to the structure of FIGS. 9a–9b;

FIG. 12a is an example of the textual output reporting, in this case annotations for mechanical specifications as applied to a detailed drawing accordingly to the General ES and Specific ES applied to the structure of FIGS. 9a–9b;

FIG. 12b is another example of the textual output reporting as applied to the structure of FIGS. 9a–9b;

FIG. 13b is a portion of a finished detailed mechanical layout of the same building and common area as shown in FIG. 13a.

DESCRIPTION OF THE PREFERRED EMBODIMENTS

The present invention is a design/drafting system for use by design professionals (also known as clients, users or client/engineers). The system is complementary to existing proprietary computer assisted drawing (CAD) software packages such as AutoCAD, from Autodesk Inc. of San Rafael, Calif., or Micro-station from Intergraph of Huntsville, Ala. Further, in a distributed network implementation, internet browser plug-in CAD-viewers can also be utilized, including InViso from Informative Graphics Corporation of Phoenix, Ariz. Note that a client may not even need to own a licensed copy of expensive proprietary software to use the present invention; the client only needs to provide a compatible drawing such as that often provided to them by their architect who would be a licensed user.

In a preferred embodiment, the system accepts client input including raw CAD information in a digital format and, coupled with a rule-based process for applying standards, generates detailed engineering specifications and information. This embodiment is described in terms of the evolution from raw architectural drawings to completed engineering drawings ("detail drawings") and related information such as equipment schedules and bills of materials. However, it is understood that the principles described herein can also be applied in other disciplines in which such a process can be applied.

Figure 1A:
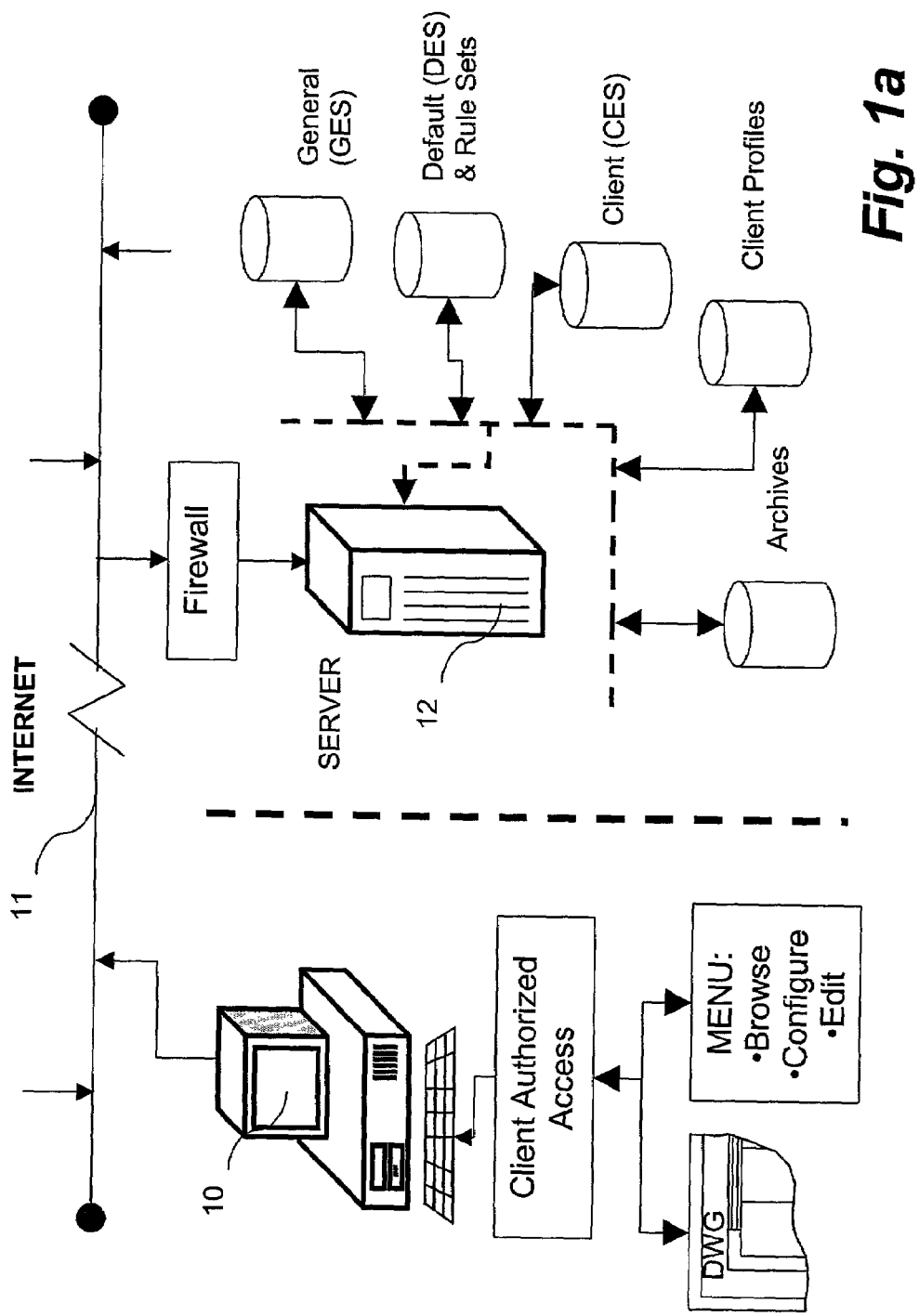
FIG. 1*a* is an overall schematic flow chart of the connectivity and functions of the present invention.

Having reference to the flow chart of FIG. 1a, a preferred system comprises several components: a client access terminal 10, such as a computer connected to a distributed network 11 such as the internet or intranet; and an application server 12. The server, and its application programming for practicing the method of the invention, comprises computer processing means including digital input and output means for receiving and writing/transmitting digital drawing information. Further, the computer provides hardware and software processing means capable of interpreting, reading and writing drawing information files, including databases and CAD files. In this preferred embodiment, the computer is a part of an internet network and more preferably as an internet server operating the method of the invention as computer instructions and having data security capability for providing administration control and further to provide the client with secure and private access to the client's own profiles and other private information. Generally, and in the context of an internet environment, the server provides an internet web site for access by client terminals 10. The system enables a novel process as set forth in FIG. 1b.

Figure 1B:
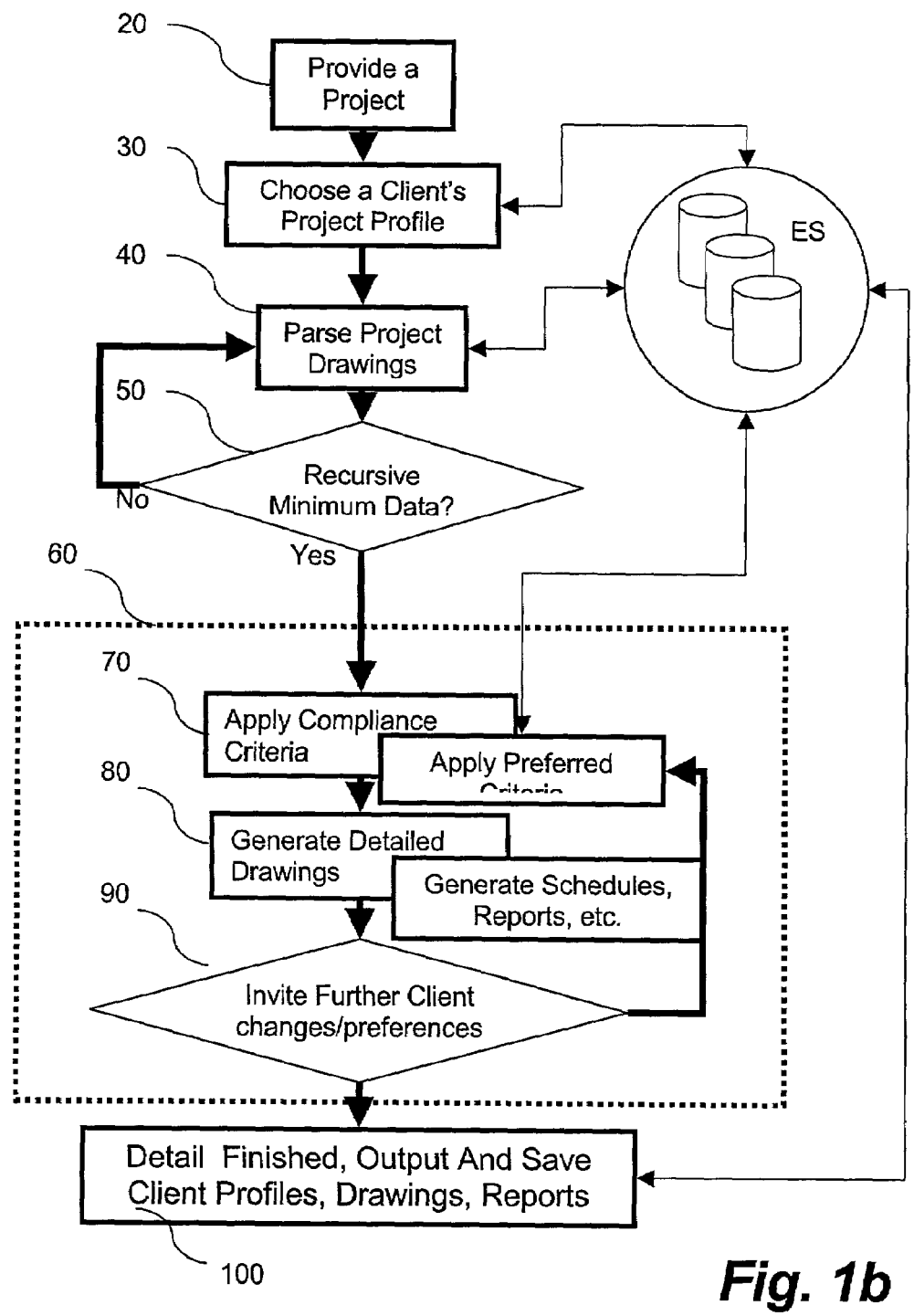
FIG. 1*b* is a flow chart of one process used in implementing the present invention.

Having reference to FIG. 1b, the process comprises: initiation 20 of a project by a client, the project defined by one or more raw architectural drawings and information; identification of the client and their choice 30 of the appropriate rules to apply to the project drawings; and validation and parsing 40 of the drawings to discover client-defined assets and their characteristics. Recursive checking 50 is applied for ensuring minimum required data is provided in the raw drawings. Next is a processing step 60 for applying specified criteria and rules 70 and enable generation of detailed specifications, drawings and reports 80. Generally, application of specified criteria and rules 70 includes interpretation and incorporation of engineering design standards into the drawing—both general criteria which are generally absolute and static, and preferred criteria which are variable or adjustable. Once the detailed specifications 80 are generated, final revisions are performed 90 and detailed engineering drawings, reports and the applied profile are delivered 100. The delivery step 100 includes output of detailed design data, annotation of engineering features as drawing elements added those provided in the raw architectural drawings and output of various reports, schedules, specifications and final detailed drawings in the same client-compatible drawing data formats originally provided at 20.

The means by which the client's project drawings are provided, validated and delivered can vary widely. At 20, a client can provide digital media containing the project drawings directly to the entity conducting the processing and receive as digital media or hard copy blueprints as a deliverable 100. Preferably, a distributed network of client computers and application servers are used for obtaining 20 the raw drawings and providing deliverables 100 as set forth in greater detail in FIGS. 1a–1c and FIGS. 2a–2c.

Specified Criteria and Rules

Figure 1C:
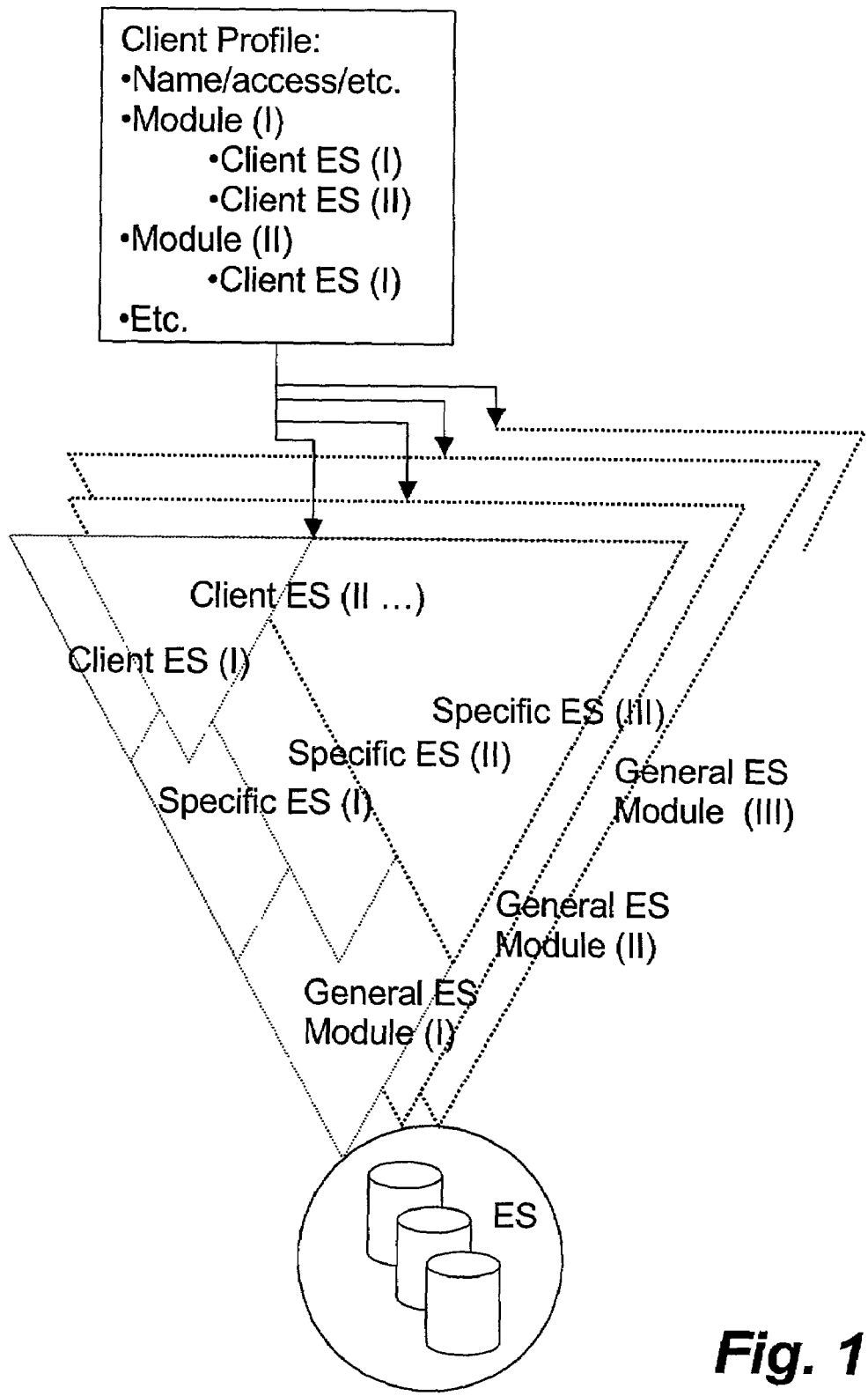
FIG. 1*c* is a schematic illustrating a relationship between general, specific and client preferred standards.

Referring to FIG. 1c in the processing step 60, the system applies rules 70 to the project in a hierarchy for determining the amount of detail necessary to prepare detailed engineering drawings. Criteria is a form of rule applied to an architectural asset. Such criteria include General Engineering Standards (General ES) and Specific Engineering Standards (Specific ES) which augment and enhance General ES. There can be multiples of each of the General ES and Specific ES, as one can see that the standards applied to an office are not necessarily the same as those applied to a school. Each office or architectural asset is more than merely geometrical characteristics such as a bounded area, or a line dimension. Architectural assets also have functional characteristics which affect the standards applied thereto. For example, a machine shop requires vastly different electrical services than does a gymnasium, even if they have the same floor area, and length of bounding walls. An asset can be a photocopier having specific electrical and ventilation requirements. An asset can be a room, or a collection of rooms, or even a parking lot having electrical service requirements.

General ES include various regulatory codes and design elements that are absolute and rarely change. For instance, the National Electrical Code (NEC) in the United States and the Canadian Electrical Code (CEC) specify certain minimum standards. The American Society of Heating, Refrigerating and Air-Conditioning Engineers (ASHRAE) sets the standards of accepted practices for the industry worldwide. The various standards and codes which establish minimum standards for compliance and generally acceptable engineering practices form the General ES. If the design professional should attempt to make a change to the General ES that would fail to meet the minimum standard the design professional will be provided with a warning of the violation of the applicable regulatory or municipal code.

The General ES are not necessarily comprehensive and reliance solely upon the General ES can result in an indeterminate solution. To make the process determinate, the process itself or the design professional must be able to impart acceptable professional standards and professional judgments, to this rule-based system, that are individual to the design professional. In this case, it is only the design professional that can dictate what is acceptable.

The General ES provide the base standards which can be augmented by specific standards. Default specific standards (Default SES) are provided by the system. Generally an engineering advisory committee predetermines a number of default options, any of which may be acceptable as a standard, but where a choice must be made. The default choices are listed and published as part of a Specific ES so that a design professional may choose any of the available listed choices or make a different selection altogether. In the simplest case, should the design professional not alter any of the default choices, the detailed drawings are generated using the General ES and Default SES standards alone. For example, while a General ES may specify whether lighting is required in each room or the size of the electrical service, Specific ES are also provided to augment the General ES such as specifying whether the detailed lighting would be ceiling-mounted fluorescent lighting or if the next greater service should be provided to ensure it could meet potential increases in demand. Examples of applied Specific ES, comprising both Default SES and Client ES's are illustrated in FIGS. 11a–12b.

The client can provide their own Specific ES and override the Default SES to form one or more Client-specific ES (Client ES). Once the client has completed a first project, one or more Client ES's result. As modules are, by their nature, substantially repetitive work, there is an opportunity for clients to create significant efficiencies in their professional practices through the use of the system. Each project is likely to result in more-and-more refined preferred criteria and form the basis for more refined Client ES and multiple Client ES's.

General ES and Default SES and Client ES are stored in respective General ES and Default SES and Client ES databases. A client can specify a Specific ES, selected from Default SES or multiple archived Client ES's.

Application of the system is not limited by distance or jurisdictions however, the applicable codes and standards, General ES and Default SES would usually be developed for a particular jurisdiction. Multiple sets of General ES can be provided, dependent upon the type of project. It is known that certain engineering standards are used in repetitive applications in numerous buildings constructed in each of the building jurisdictions in North America. These standards are compiled into a plurality of module types. The modularization of building types aids in the preparation of projects that are relatively small in comparison to industrial engineering projects, where there are numerous hours expended and there is little repetitive design/drafting functions. An example of such modules includes a school, or an apartment/condo—electrical module and an apartment/condo—mechanical module. Further, while North American standards are substantially the same, there are differences; such as between the Canadian and US National electrical codes (CEC, NEC). Preferably, modules are developed and provided for jurisdictions in North America having the largest building volume, with preference to jurisdictions where market analysis demonstrates a greater potential for use. Further variations in standards are more readily provided within the Specific ES or Client ES.

The modularized approach allows the system to deal with a manageable number of considerations and variables in preparing General ES and Default SES for that module and further allows the client a manageable opportunity, through the Client ES, to imprint on the General ES and Default SES the client's own professional preferences. The client can browse the General ES for each module enabling review of the applicable engineering standards and choices.

The General ES, Default SES and Client ES are applied to the raw architectural drawings for generating engineering specifications and information suitable for creating detailed drawings including mechanical and electrical drawings. It is seen that the system generates drawings that not only reflect the professional judgment of the client but will also output accurate drawings, delivered with a very quick turn around time and which are very cost effective when compared to the manual alternative for the preparation of drawings.

The Raw CAD Drawing

Figure 2A:
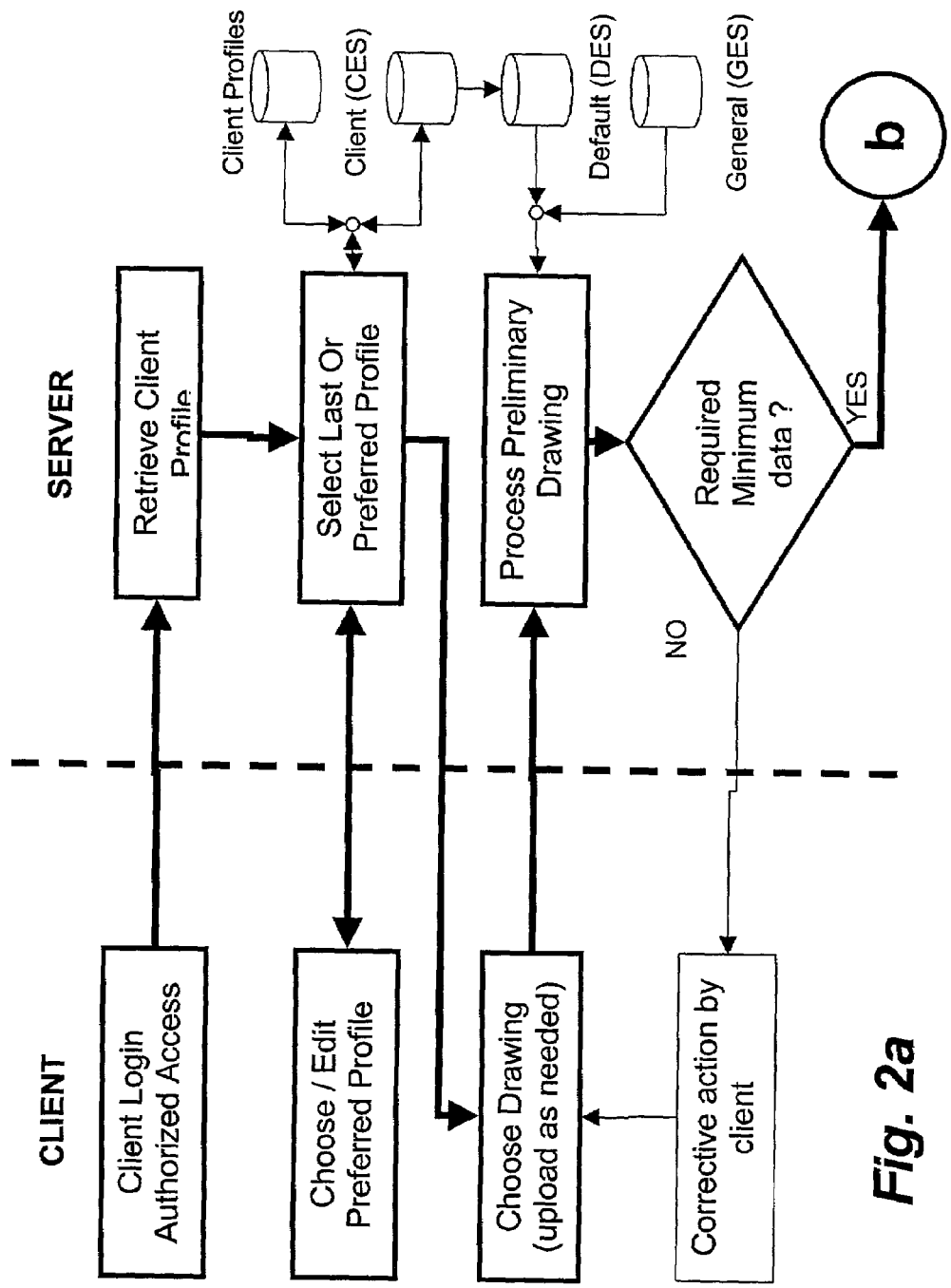
FIG. 2*a* is a more detailed flow chart of an embodiment of the system of FIG. 1*b*, detailing uploading of a preliminary CAD drawings and recursive checking for a minimum required data necessary for processing.
Figure 2B:
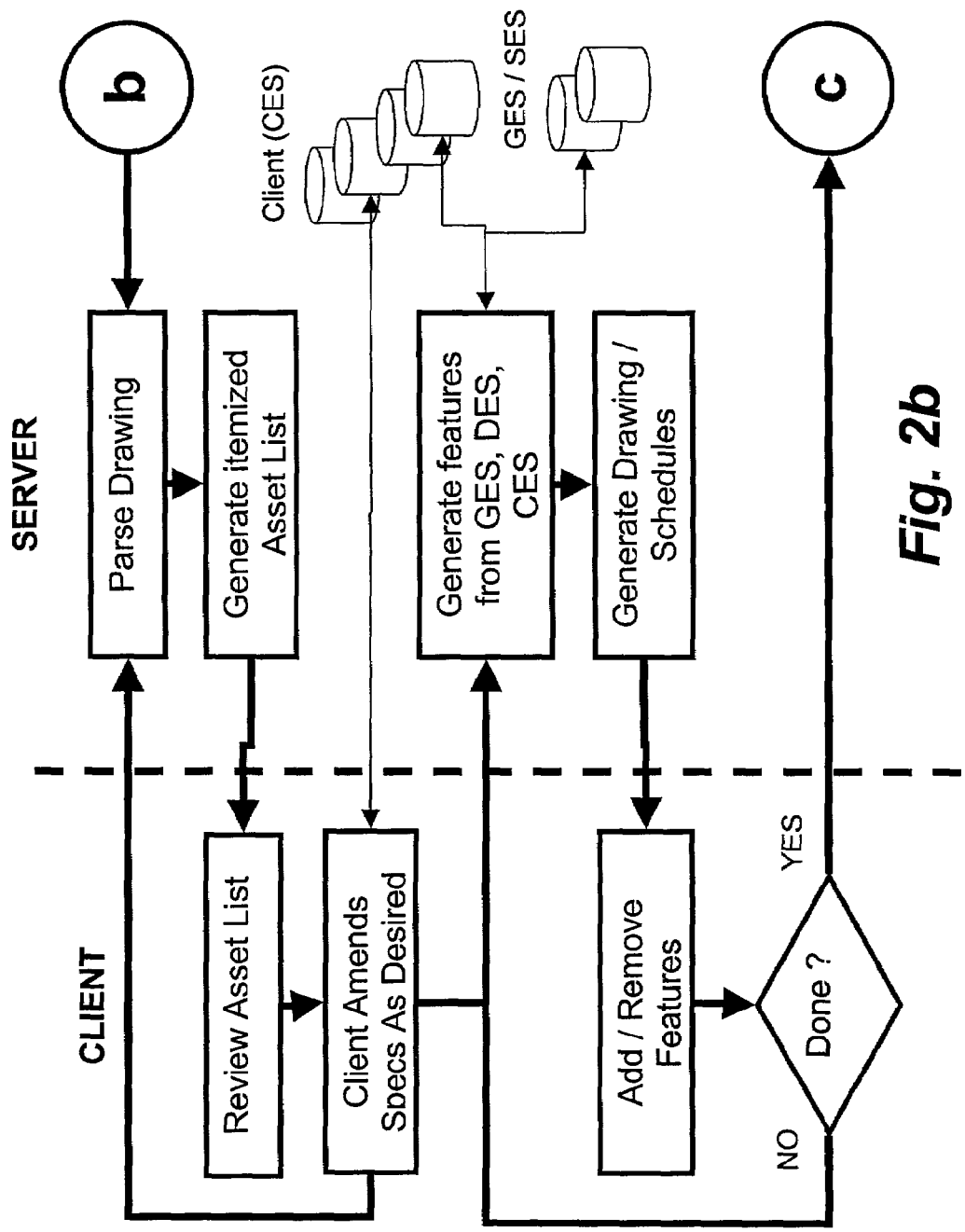
FIG. 2*b* is a flow chart of the system, continued from FIG. 2*a*, for parsing a CAD drawing, determining its assets and the application of general, specific and client criteria to add engineering features.

Referring to FIG. 2a, to provide a new project 20 a client uses the terminal 10 and an internet web browser to log-in through the internet 11 and to the web site on the server 12 which is secured and which requires the client to provide a username and password combination to assure authorized access. After log-in, the server 12 initiates an application program which identifies the client and retrieves one or more stored known client profiles 30. A client profile can include their identity, their billing arrangement, and last project information such as the last drawings, module or Client ES databases used.

The server 12 displays a menu of hyperlinks. While the possible display options are virtually unlimited, the hyperlinks typically include functional equivalents to "work on a new project", "retrieve/edit an existing project", "profile configuration", "download needed software", among others. Upon clicking a hyperlink so as to choose new project, the client's profile is invoked and directory listings, along with some basic file management functions and directory navigation options, are presented in the browser screen, typically listing a client's drawing files and folders that are present on the server.

A client can choose a project which can include one or more drawings. Such project files may already be stored on the server 12, or can be uploaded to the server. The client must choose or upload one or more raw architectural CAD drawing files and other associated data as necessary and in a format compatible with formats supported by the server's applications programming. Herein, unless the context suggests otherwise, the term "CAD drawing" or "drawing" includes associated text and other data annotated thereon or provided in separate files.

In a simple embodiment, the client provides raw architectural data and supplementary information in a compatible format including that provided in a CAD file. Such means can include suitable storage media containing the necessary information or that provided via an internet network system. A suitable CAD file includes those compatible with AutoCAD*.DWG format which can include both vector graphics, which define the architectural elements, and textual elements, which can define supplemental information such as ceiling height. Optionally, supplemental data is provided in a separate digital file. Once uploaded the file or files appear in the client's directory. To process a preliminary architectural CAD drawing the client selects the appropriate file in the directory (by clicking on an adjacent radio button) and then clicks on a process button.

As a default the server will select a previous client profile, or determine the profile from the nature of the CAD file. Otherwise, the client chooses a profile and a module to apply to this drawing; the module being specific to jurisdiction and the type of structure. These issues determine which criteria are imposed upon the design and which affect the ultimate detailed engineering drawings and reports. Once a module is selected, default choices are provided. The design professional then either accepts or overrides the General ES and Default SES or overwrites some or all of those standards with their own Client ES which the client wishes to embrace for projects within the module type. These modification and instructions are variable from project to project and reflect the special needs of an end user of the building, or of the design professional, arising out of the performance requirements of the project upon completion and thereafter. Interactive and formatted reference forms facilitate the creation of the design professional's Specific ES. Mandatory field response requirements aid in assuring all the necessary design data is obtained. Once completed, the resulting modified Client ES can be archived on the server 12. Those Client ES are proprietary to the client, password protected and stored for future and repeated use by the design professional for reuse on subsequent and similar projects.

Filtering—Confirm Minimum Data

Still referring to FIG. 2a, the process assesses if the CAD drawing has the minimum necessary data, structures and assets necessary for interpretation of the drawing. This assessment can simply include a rudimentary filtering to confirm that the drawing and information is in a compatible format or could be as much as a full parsing of the drawing described in greater detail below. If insufficient information is provided, then an interactive dialogue between the server's application program and the client ensues to correct the client's formatting of the drawings. In early sessions, it may be necessary to further involve the server's professional staff. Various interfaces are provided for ensuring that enough information has been provided by the client. Primary interfaces include forms having fields which must be filled in before submission and mid-processing interfaces which request additional data. The format of the forms is dictated by the module and the various ES's.

The results of this interaction are incorporated into the client profile and resulting Client ES so as to minimize need to revisit these questions in the future. The input data is tested against a minimum checklist and further processing is not conducted until the minimum number of elements is provided. Further, the filter ensures that the format of the file can be reliably interpreted. Such formatting includes specifying which of the CAD drawing's many layers, such as floor plans, sections and elevations, contain the expected electrical appliances or building elements, including but not limited to doors, windows, interior and exterior walls, ceilings, cavities, structure, ceiling materials, ceiling heights, and materials insulation factors.

Parsing the Drawing

Referring to FIGS. 2b and 3–5, a parsing or recognition process is performed on the architectural drawings for interpreting and determining major or key structures or assets of the architectural design. The system reads the known data format for the CAD file and extracts the assets. As stated earlier, one well known and published format is the AutoCAD native drawing file format DWG. Another format is a Drawing Interchange File DXF. Use of the native DWG format is discouraged due to the variability of its organization from version to version. The overall organization of a DXF file is typically as follows: a HEADER section containing general information about the drawing including an AutoCAD database version number; a CLASSES section holding information for application-defined classes, whose instances appear in the BLOCKS, ENTITIES, and OBJECTS sections of the database defined hereafter; a TABLES section containing definitions for various symbol tables (not described herein); a BLOCKS section containing block definition and drawing entities that make up each block reference in the drawing; an ENTITIES section containing the graphical objects (entities or elements) in the drawing such as a vector from X1,Y1,Z1 to X2,Y2,Z2; and lastly for the descriptive purposes herein, an OBJECTS section containing non-graphical objects in the drawing such as text and dictionaries of the line styles.

The system interprets the raw architectural data for assessing the layout of the structure from a combination of drawing elements including numbers of rooms and floors, locations of windows, doors and stairways. Limitations in some recognition algorithms may require the entities or drawing blocks to be closed to be recognized, as discontinuous endpoints are problematic.

Figure 3:
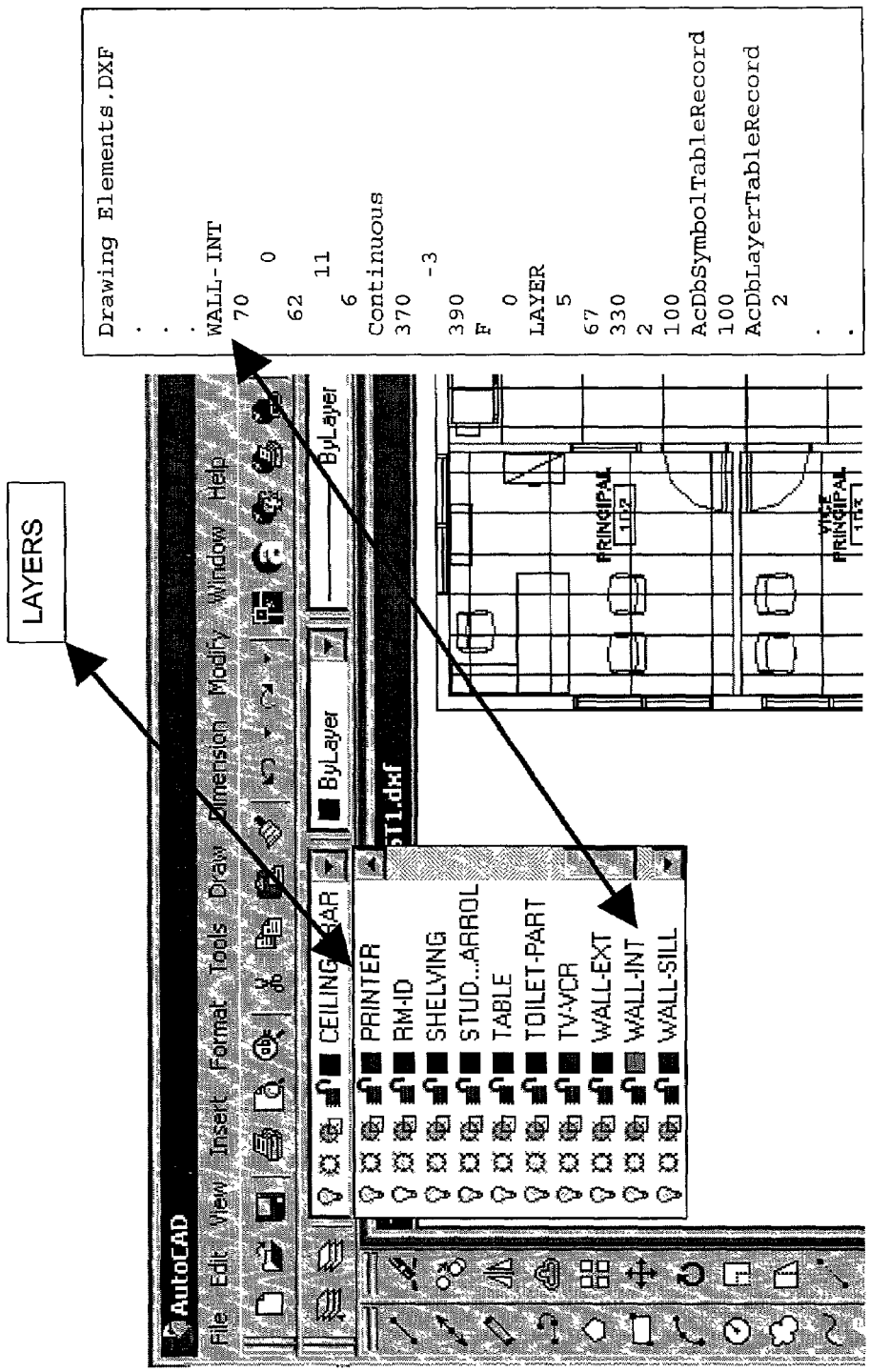
FIG. 3 illustrates a raw architectural drawing which includes various defined drawing layers which aid in the recognition/parsing process; a portion of a text-version drawing exchange formatted (DXF) file illustrating a drawing element under the named layer WALL-INT.

Referring also to FIG. 3, a typical drawing comprises layers, each layer storing related drawing elements. The illustrated sample drawing is displayed in an AutoCAD program with a drop-down menu function selected for displaying the named layers. In the example drawing, all elements defining internal walls are located in the layer named WALL-INT. This format of placing known assets in named layers assists in parsing assets, such identifying in which layer electrical plugs could be located. In another layer PRINTERS, all entities representing computer printers are located, providing the means to determine the lengths and need for data cabling and power. A room identification layer RM-ID is provided for indicating the type or purpose of each identified asset (e.g. a device, a room, a collection of rooms); whether it be a heavy industrial shop area which requires special and higher amperage electrical outlets, or an office requiring multiple low amperage outlets and additional data cabling.

Using comparative examination techniques and the predetermined formatted input data, the system parses the drawing, recognizing, labeling and storing the labeled key building assets in an architectural assets database.

Figure 4:
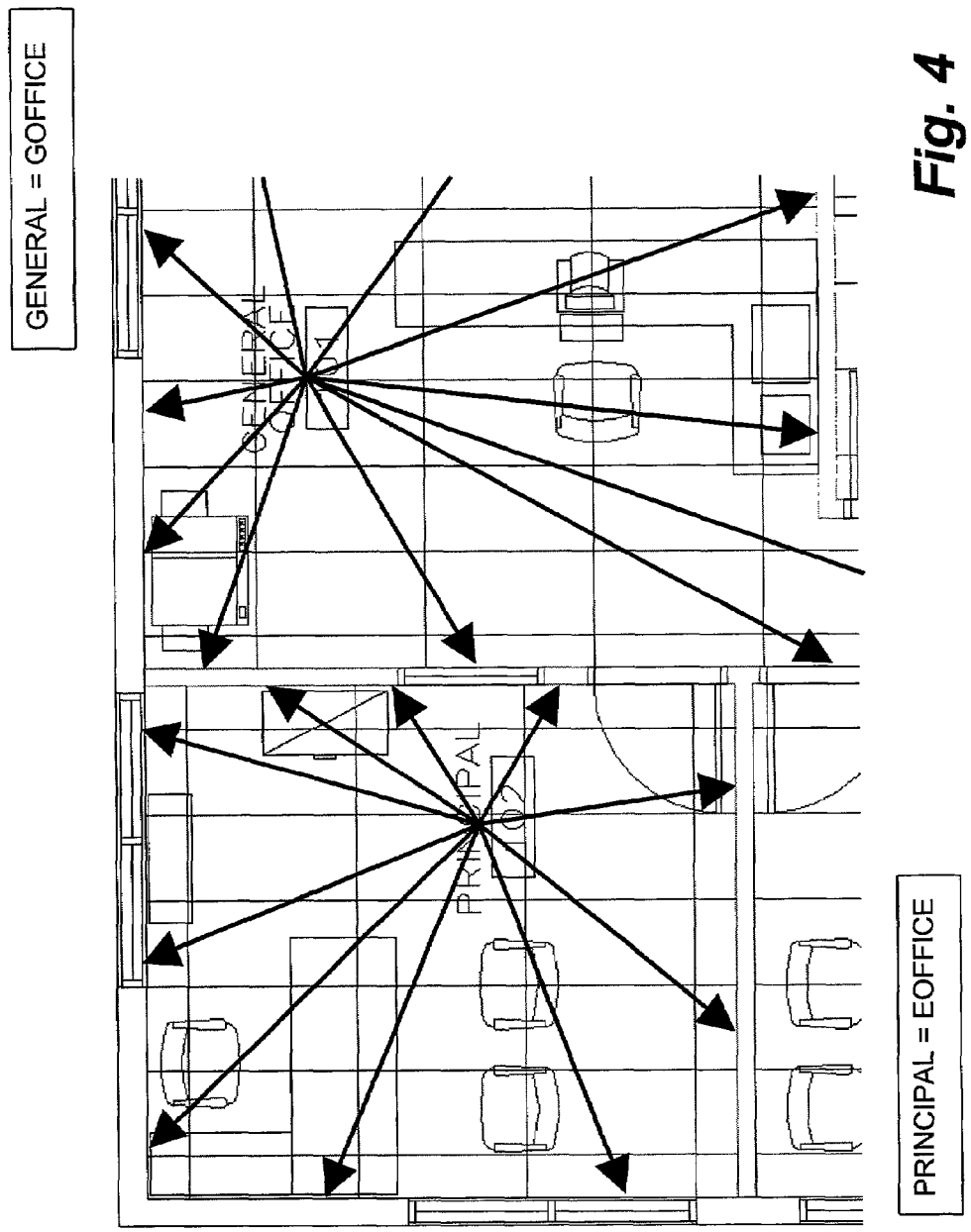
FIG. 4 illustrates one recognition/parsing process for determining assets, such as bounding walls in a raw architectural CAD drawing from a room ID label, these room ID's corresponding to assets EOFFICE and GOFFICE.

Turning to FIG. 4, for example, a preferred recognition process is illustrated in which the coordinates of the RM-ID are located. The bounding walls are located and the area of the room is determined. One preferred approach is to search radially in the WALL-INT layer for bounding internal walls. Where a discontinuity exists, the center of the radial search can be incrementally moved to another location so as to determine if the discontinuity is an open passage, or a drawing error.

Assets recognized in the parsing step will correspond to known assets stored in the architectural assets database, otherwise design criteria and rules cannot be applied. For instance, in this example, the client must advise in the initial data or Client ES that both the principle's and vice-principal's offices are equivalent to a stored database asset EOFFICE, for which certain common Specific ES criteria or Client ES and rules can be applied. Either the client can conform to the format required by the server's application program (which layer contains which information) or the client's profile could contain information to enable mapping of their proprietary format to the application programs requirements.

Having reference to FIG. 5 and in a review step, once all the necessary formatting is provided, the raw drawing is parsed and the client is presented with another interactive form displaying the recognized assets. This is an opportunity for the client to amend and revise the criteria which has been applied to the assets. As shown, the filter step applies the client's last Client ES, or a Default SES for making a preliminary assessment of the assets contained in the drawings. The application program can apply such preliminary defaults upon determining that assets include "CLASSROOMS"=a school, or an asset "LIVING ROOM"=apartment/condo. Accordingly, a first form is provided so that the client can override the Default SES's choice of the default type of electrical outlets, the number of outlets, and the rating of these outlets for each asset or room in the preliminary CAD drawing. Using an electrical example, FIG. 5 further illustrates use of a table format for quick and easy review by the client, with the asset tabulated against a drop-down menu of the particular standard applied, and the outlet type (such as between duplex, split, half-switched, etc).

Apply Standards

As shown in FIG. 6, with the minimum requirements having been met, a second interactive form provides an expandable configuration tree or list where the client can vary or adjust the applied General ES, and Default SES rules. In the electrical example as shown, one enters project specific and preferred data in the text boxes, by selecting from drop down menus or by selecting, via radio buttons, the rules that pertain to the project. For example, clicking on the + expand symbol next to the "Corridors" heading reveals more detailed rules– such as those allowing the client to specify how far the electrical outlets are spaced apart and the amperage rating of these outlets. Once expanded, the + symbol next to the heading changes to a – symbol, which, when clicked, collapses that part of the configuration tree. Many other headings are included in the configuration tree, each independently expandable/collapsible and each allowing the client to make changes to the default rules and settings.

Once the client is satisfied that the parameters and rules are properly set, the form and its settings are posted to the web server by clicking the "submit" button on the bottom of the form. When the information in the form is received by the server, an application program at the server generates detailed features according to the criteria set by the General ES, Default SES, individual Specific ES, and Client ES as modified by the form.

Further, the application program can apply the detailed features to generate a detailed CAD drawing from the preliminary architectural CAD drawing. Such modification includes adding drawing elements to the CAD drawing which represent lighting, electrical outlets and mechanical components. One method for reviewing the results includes opening a new browser window which, using an appropriate third-party plug-in, displays a visual preview of the modified CAD drawings and schedules. The client can then inspect any part of the preview and determine the design was performed as expected.

Upon previewing the output drawing file, the client may determine that revisions to rules and the drawing are required.

Having reference to FIG. 7, the original browser window is refreshed and now contains another form. The form can be a schedule in table format listing each of the detailed features or additions made to the raw CAD drawing, together with their accompanying information. For example, each of the resulting electrical outlets are all given a unique and incremental identifier, and their location on the CAD drawing is identified by x, y and z co-ordinates. The client is able to remove any one or all of the electrical outlets by clicking on an adjacent check-box button which is in the "remove" column in the far right of the table. Information for the resulting electrical panels is then displayed in a second table underneath the first schedule. Again, each panel is labeled, and the total of the electrical loads are summarized at the bottom of that table.

When the client is satisfied that all the detailed features, such as all the electrical outlets, are satisfactory and that any that are to be removed have the check-boxes highlighted, then this form is posted to the server by clicking the "continue" button. When the information in the second form is received by the server, the server will modify the CAD drawing, if necessary, removing any of the additions selected with the check-boxes.

Another new browser window pops up displaying a visual preview of the finalized CAD drawing.

Processing—Deliverables

Figure 2C:
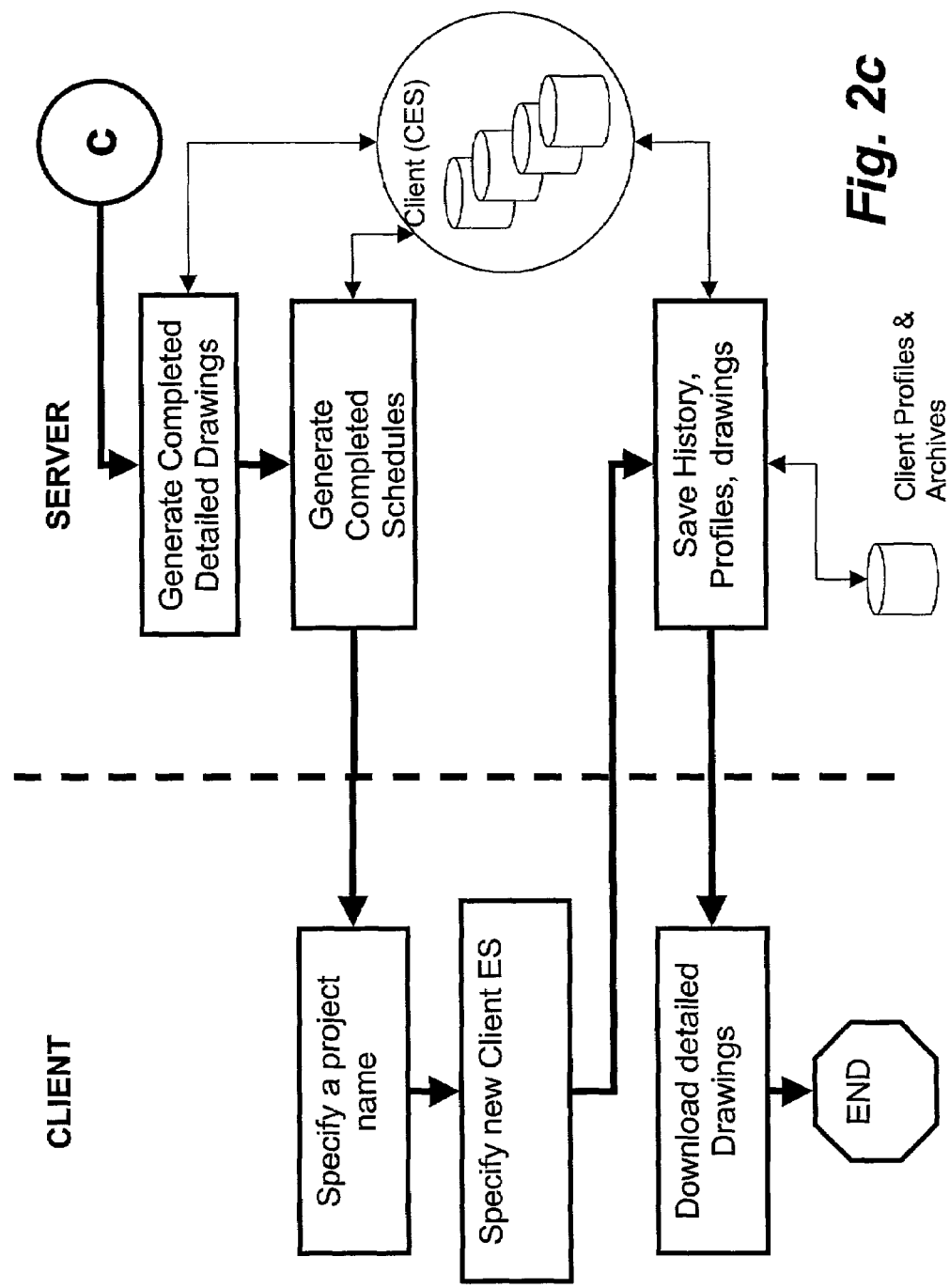
FIG. 2*c* is a flow chart of the system, continued from FIG. 2*b*, for accepting touchup modifications and generating detailed engineering output CAD drawings and updating of the client preferences.
Figure 8A:
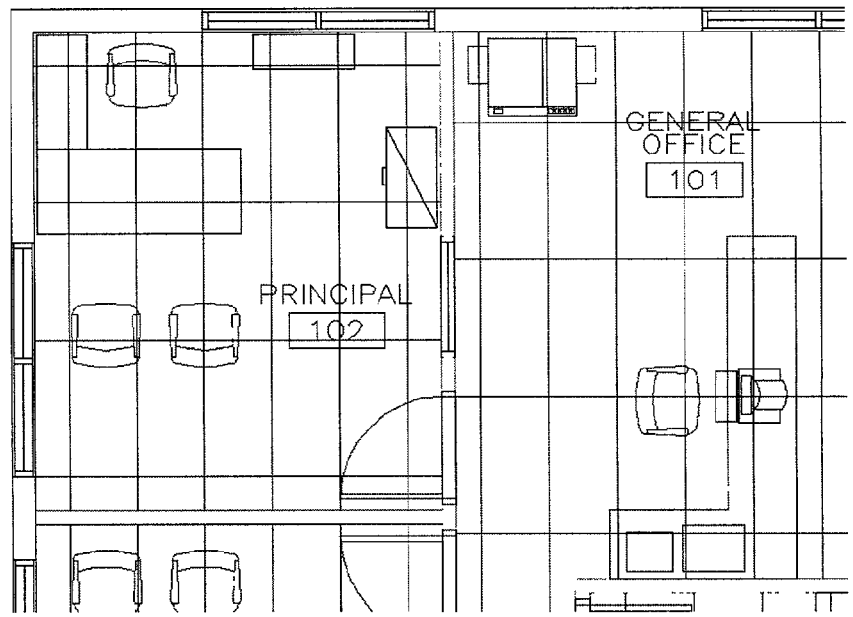
FIGS. 8a and 8b are raw architectural and output detailed electrical engineering CAD drawings for a portion of a school, using the criteria as set forth in FIG. 6.
Figure 8B:
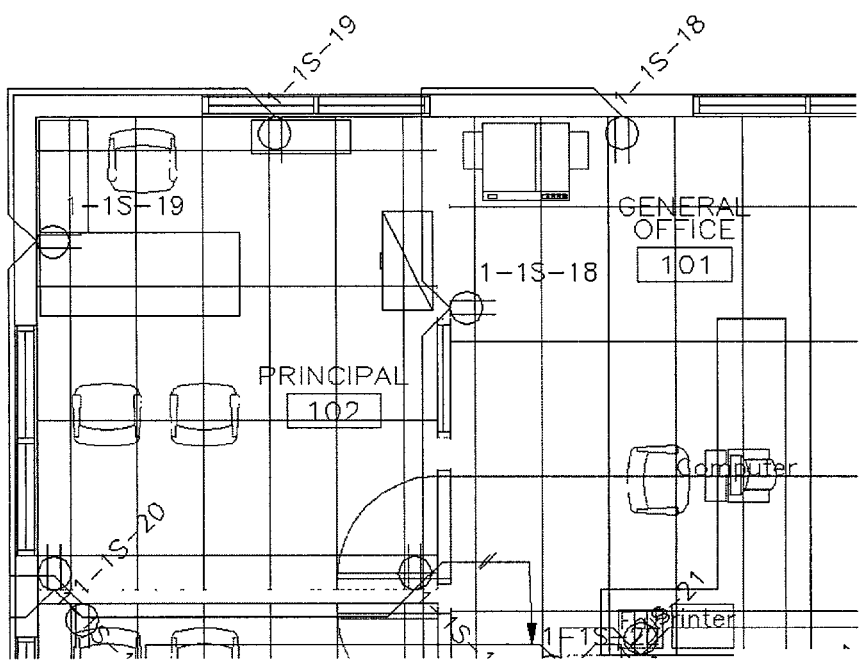
Figure 9A:
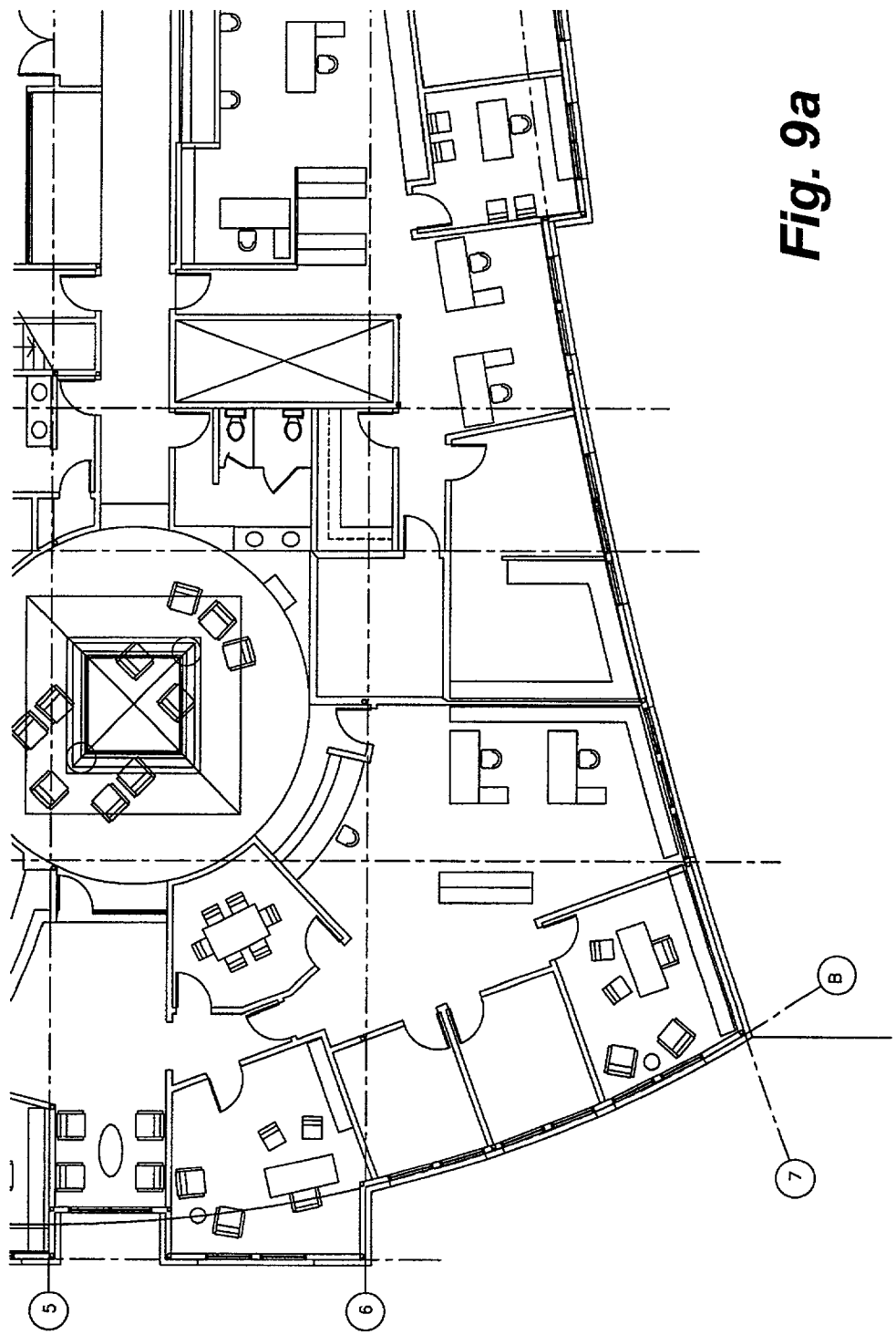
FIG. 9a is a portion of a plan view of an architectural drawing demonstrating the plan of a structure.

Having reference to FIGS. 2c and 8a,8b, deliverables or output comprises detailed engineering specifications in a format including both detailed drawings and specialized reports, such as specification schedules, mechanical schedules and bills of materials. Other output and reports can include shop drawings, catalog cuts, operation and maintenance manuals, details regarding insurance compliance and requirements, published design reports, tabulated charts/values/quantities, and Underwriters Laboratories (UL) set/assemblies. For the drawings, the mechanical and electrical details are rendered in the appropriate client's preferred CAD format to create the one or more required mechanical CAD drawings, electrical CAD drawings, any annotations and associated reports.

Having reference to FIGS. 8a and 8b, a raw architectural drawing is shown (FIG. 8a) and a detailed electrical output drawing resulting from the present invention is also shown (FIG. 8b), complete with annotation and unique identifiers for each electrical outlet. Such unique identifiers can be used by the contractor in physically labeling and tracking the electrical outlets.

The original browser window is refreshed and then contains an option to save the finalized CAD drawing or drawings. A request is made to assign a name for the drawing or drawings in the project. By entering a file name, and clicking the "save" button, the server saves a copy of the finalized CAD drawing. Any adjustments which were made to the preferences can also be saved to the current client profile, to a new named profile, to a current Client ES, or to a new Client ES. The client is provided with file management functions and directory navigation options as before; including the ability to download the newly created CAD drawing from the server.

Figure 10A:
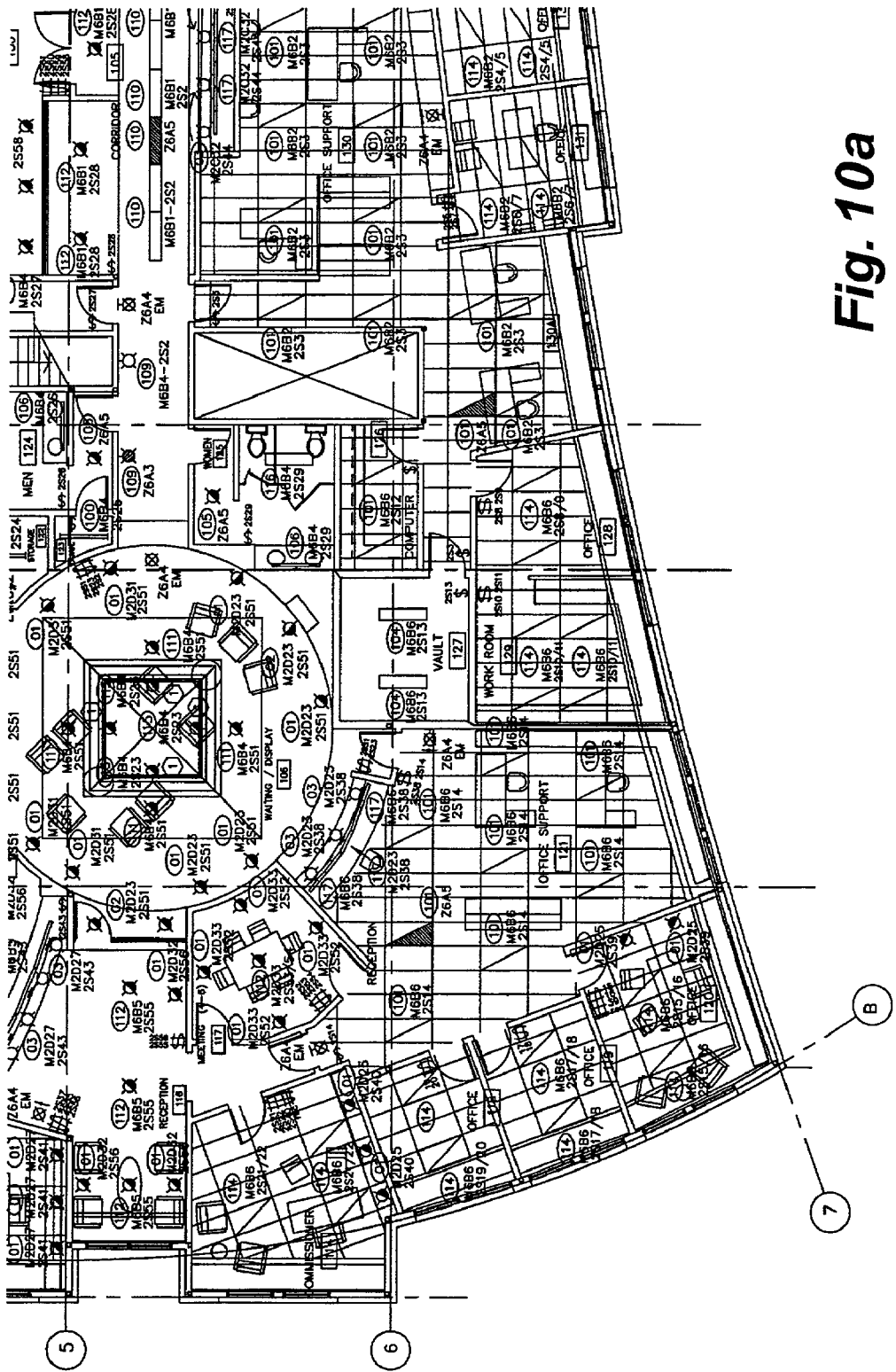
FIG. 10a is a portion of a plan view of the finished detailed electrical drawing of the lighting for the structure of FIG. 9a, said drawing in compliance with the General ES, Specific ES and Client ES applied thereto and output in a detailed design CAD file.
Figure 10B:
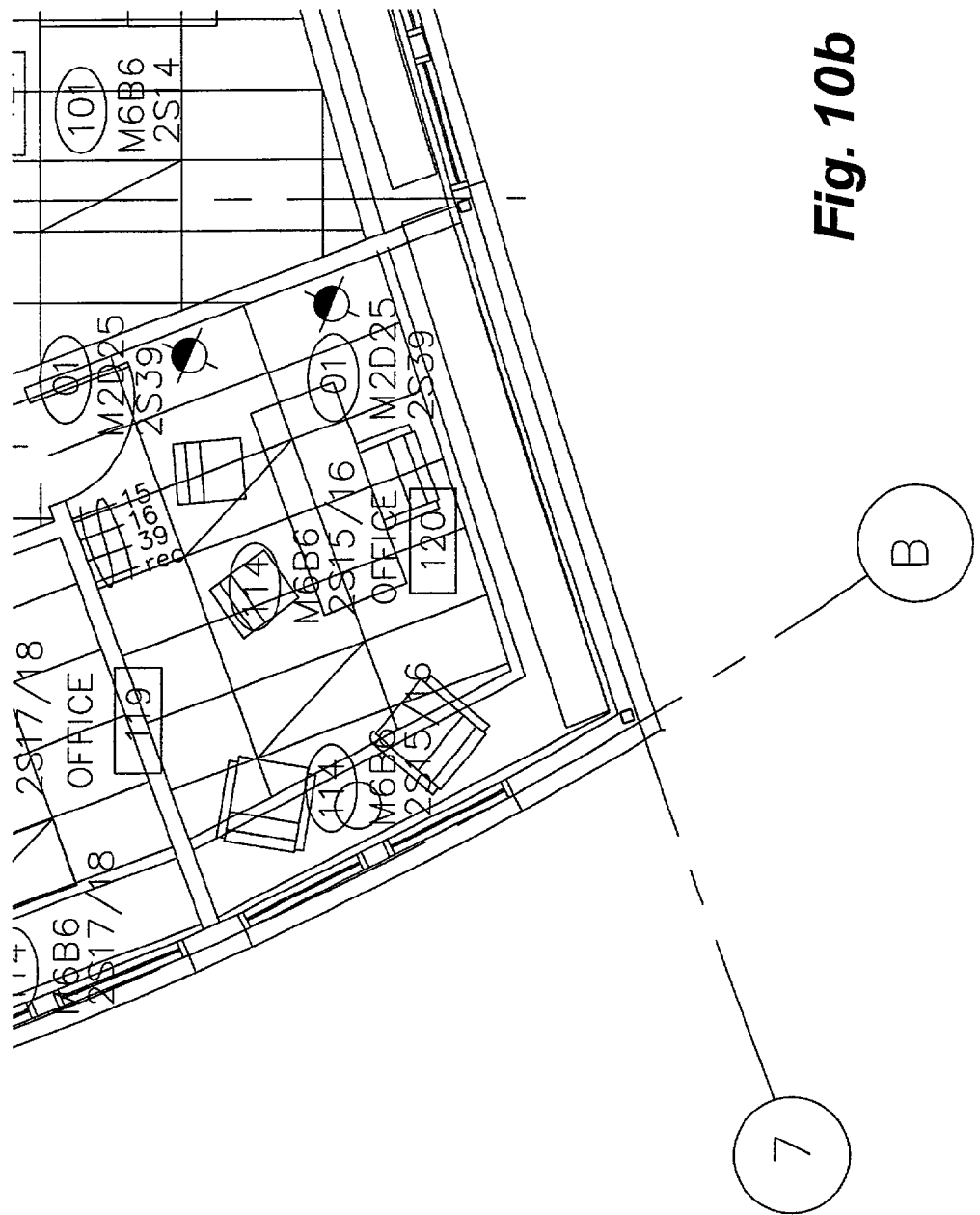
Figure 13A:
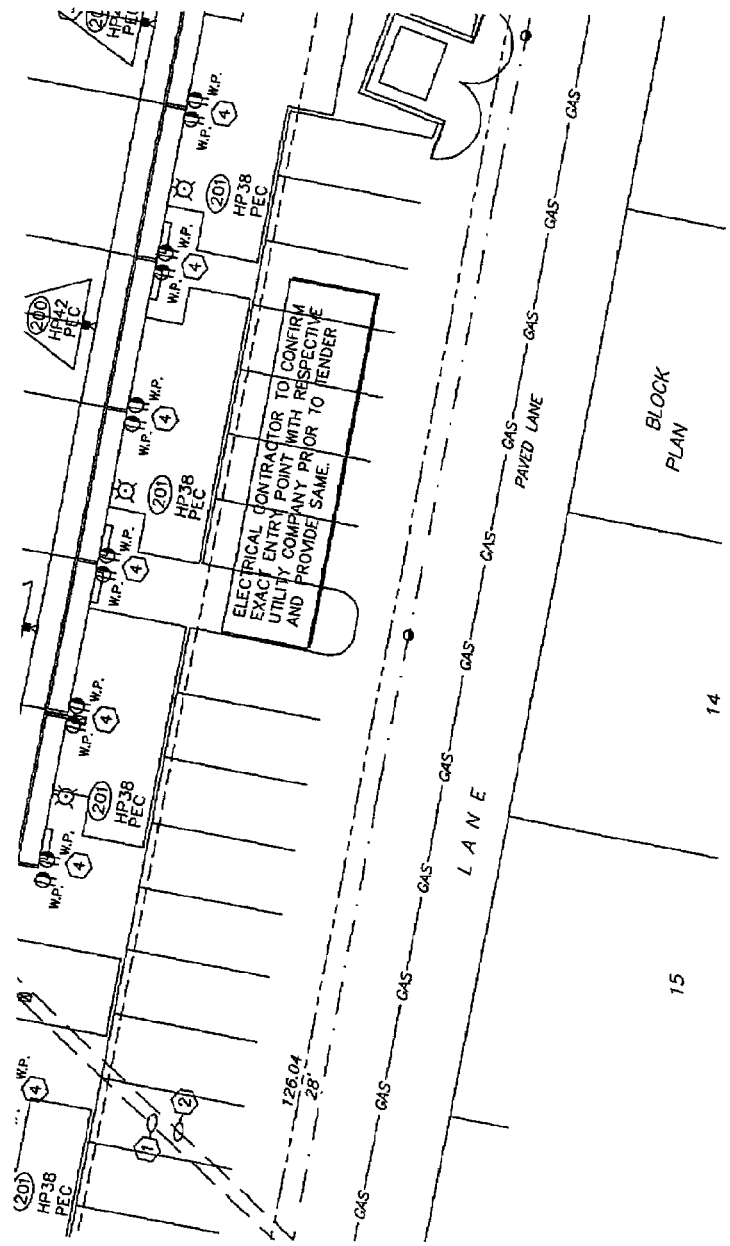
FIG. 13a is a portion of a finished detailed electrical layout of a building and common area.
Figure 13B:
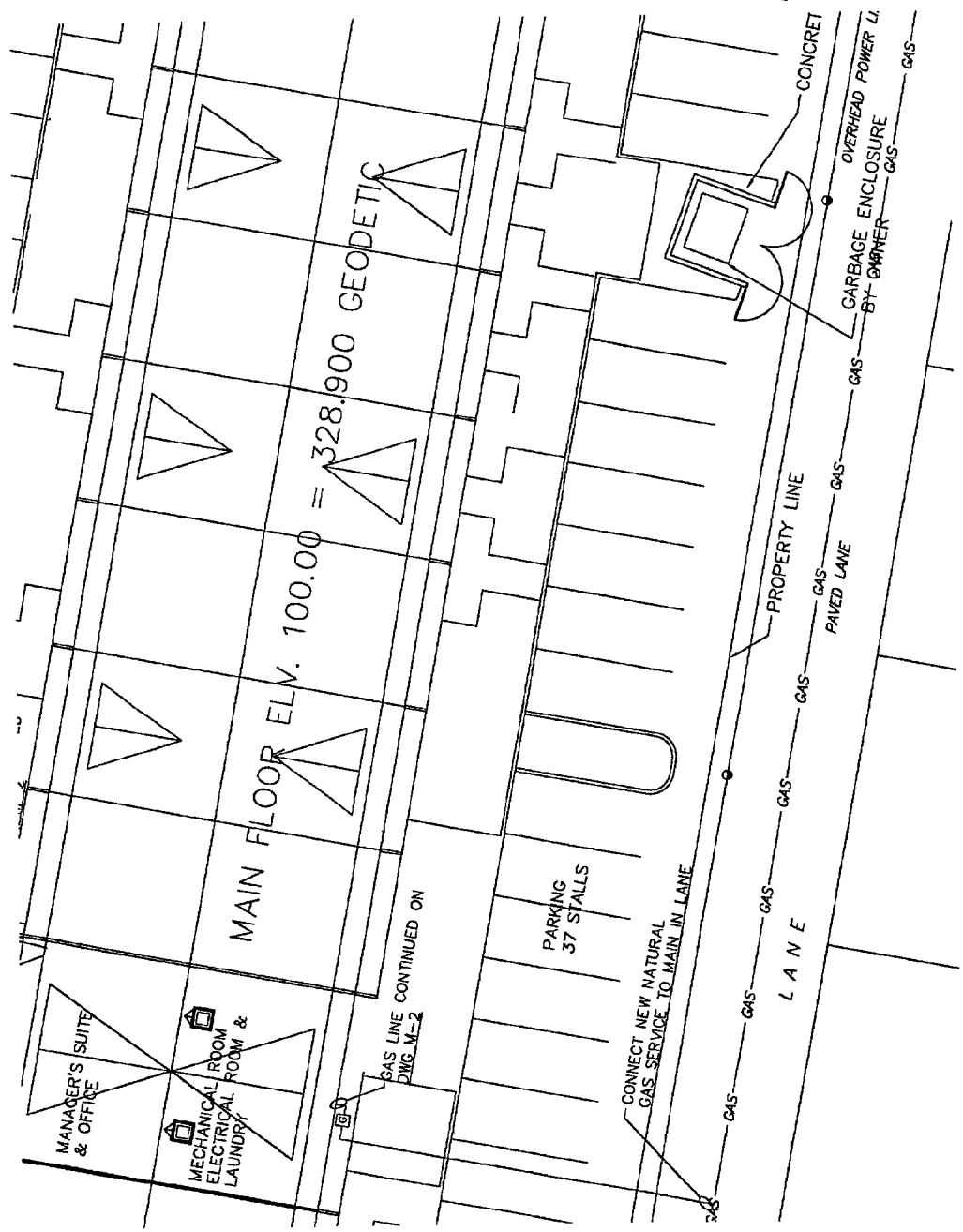

Additional examples of architectural CAD drawings and detailed output CAD drawings are shown in FIGS. 9a–10b and in FIGS. 13a and 13b. The output files illustrated in FIGS. 10a and 10b illustrate comprehensive detailed engineering specifications including lighting. FIG. 13a illustrates output detailed electrical specifications including annotations such as an electrical legend. FIG. 13b illustrates a CAD drawing with added detailed mechanical specifications.

Example of the Hierarchy of Standards

One example of a design professional or engineering-client is a specific project engineer who is approved to utilize the system of the present invention on behalf of a third party. Alternatively, the engineer uses the system for their own projects, such as for a chain of similar facilities—such as gasoline stations. The client's organization would retain one or more Client ES databases from past projects. The Client ES includes the specific choices made including those from the General ES and Default SES. On the other hand the client may choose to have each project engineer use their own individual Client ES's for the same raw architectural CAD drawing as individual preferences tend to vary from engineer to engineer. In cases of an in-house design of repetitive facilities, Client ES information can also come from non-engineering personal where they relate more so to qualitative and value choices, rather than to code or Specific ES issues.

In other cases, the client is often a building or project owner. In such situations an architect usually represents the client and has input to the preferred parameters. A client could also be a school division, in which case certain broad concepts and parameters would be inputted to the system from information given from the senior maintenance official or design criteria team leader from the school division. Other more specific information would be obtained from the architect hired by the school division. This information would be tempered by the desires of the school board, but would provide specific direction regarding quality, aesthetics and performance of the systems being engineered.

As stated previously, the standards are rules or set instructions assembled in the system that are referenced in the process of expediting a project or portion thereof. Rules fall into two categories. An absolute rule is one that is neither adjustable nor modifiable to suit the specific project or client need. These rules for the most part are located in the General ES and include minimum code standards, or are widely accepted General ES that are fixed. In some cases, where the absolute rule is made up in part of a variable (e.g. a number, value, yes/no decision). These rules are stored in Default SES or Client ES databases. The system permits adjustment or modification of these Default SES or Client ES rules, however, the systems clearly notifies the client that this rule has been changed.

The second category of standards is adjustable rules. These rules are modifiable to suit the needs or desires of the client and have default settings or values which can be modified or adjusted.

The following are examples in an electrical engineering context. Other applications include architectural, municipal planning, infrastructure, structural and mechanical.

An absolute General ES rule could be:
Lighting fixtures recessed in fire rated ceilings must be fire rated themselves or have a drywall enclosed fire rated box put over them.

Or

Ceiling mounted lighting fixtures cannot be lower than 6'6" above the floor unless they are vandal proof or have a wireguard.

Alternatively a Default SES adjustable rule could be as follows:
Where recessed T-bar ceiling mounted lighting fixtures are placed in a room, they are to be located as evenly distributed as possible, while still following the T-bar pattern.

A Default SES or client specific Client ES variation to this rule on a specific project with abnormal amounts of exterior glass might be:
Where recessed T-bar ceiling mounted lighting fixtures are placed in a room, they are to be located as evenly distributed as possible, while still following the T-bar pattern. Assume the exterior 4' of the room along glazed walls is not part of the room for lighting purposes.

The General ES database outlines the specific applicable codes to be used on the specific project. It will allow for interaction by the client to input local jurisdictional changes to suit specific county or municipality regulations. State wide, Province wide and municipal codes are available as "default" choices.

The absolute rules of various codes are imbedded into the system and can be adjusted only where numerical values are part of the code, and then only if the client is reminded that these values do not comply with codes. The reason to allow variability in values is to allow the client to determine the effect of adjusting the code values. There are times when an client or end user are concerned about a specific code or building regulation causing extra capital cost or operating expense. Depending on the result, the client or end user may try to have the space utilization renamed, or relaxation from local authorities. A good example of this is the need for ventilation in shops for welding. Depending on the duration and extent of ventilation costs can change dramatically. In most jurisdictions, however, if a shop is called a "welding" shop instead of a "machine" shop the ventilation requirements change.

An example of codes implemented in a General ES includes:
Electrical Code (local jurisdiction),
ASHRAE Standards,
NFPA, and
Building Code (local jurisdiction).

In addition to the General ES, a client's Client ES is provided. The Client ES is a fixed record of the summary of rules used in expediting the project and is stored as a reference for future projects by the same client. A client can import the General ES data into their Client ES, or through interaction with the system, so that the bulk of the General ES, Default SES and Client ES for an old project can be applied to a new project and yet are also modifiable to suit the new project.

General ES's include those engineering practices that are widely accepted across the industry. These are practices, choices and value decisions that rarely change, no matter what the location, project or who end user is. The General ES database is modifiable by the client and can be reused from project to project.

The General ES data form as it relates to the sizing of power feeders to electrical panelboards may appear as follows:

Rules for sizing electrical feeders to panelboards:
1. Where calculated load is less than or equal to 80 amps, use 100 amp feeder, except for 3 below.
2. Where calculated load is above 80 amps, but less than 160 amps use 200 Amp feeder, except for 3 below.
3. Where a feeder is greater than 100' in length it should be sized at 20% above calculated load plus voltage drop considerations.

Note: Conduit and wire feeders are available at many sizes between 100 plus 200 amps however; there is little or no economy in using an odd size due to the way materials are priced.

The Specific ES are engineering practices that are commonly variable from client to client and area to area because of their personal preference. These practices are based on choices, value decisions and engineering/construction methods that can vary widely. The Specific ES database is modifiable by the client and can be reused from project to project. The client can assemble a series of Specific ES's to be used on a variety of projects, depending on the end user, location, type of project, budget, etc.

A good example of Specific ES is standard for the number of electrical outlets on a particular 120 volt circuit. The Canadian Electrical Code states no more than 12 outlets permitted. Rarely do 12 go on a circuit, except in residential design.

General ES would call for 6–8 outlets per circuit for average use in most buildings. This "rule of thumb" is inadequate because a machine shop will have outlets in offices, work benches, outside for maintenance etc, all for different purposes. The Specific ES clarifies all of this.

For example:
1. Specific ES rules for circuiting receptacles.
  1.1 Office area 6 outlets per circuit, except for specific loads labeled.
    1.1.1 Xerox,
    1.1.2 Printer,
    1.1.3 Car plug in,
    1.1.4 GFI outlet in washroom,
    1.1.5 Fridge,
    1.1.6 Microwave,
    1.1.7 Coffee Maker, and
    1.1.8 Counter top Receptacle other than 5, 6, or 7 above to be 2P.15A spit feed outlet.
  1.2 Shop Area:
    1.2.1 Columns—2 receptacles per circuit, alternate circuits so no two receptacles are adjacent on same circuit.
    1.2.2 Work benches; 2 receptacles per circuit; alternate so same circuit not adjacent.
    1.2.3 Four-plex outlets on drop cords get two circuits per 4-plex. Use 2P.15A receptacle.

Specific ES's variable design criteria are project specific and would ideally come from archived design criteria which was used specifically by the client on previous projects to expedite a project or portion thereof. Such information often involves value judgments, safety factors and margins of error type of qualitative choices. An example of a Specific ES as it relates to the lighting of a 12'×10' office might have the following:

1.1 Lighting levels—Minimum 60 footcandles,
1.2 Energy Conservation—Less than 2 W/square feet,
1.3 Choose minimum number of fixtures, maximum 4 lamps each,
1.4 Maximum 1200 W/circuit@120/208V, 3000 W per circuit@347 Volt, and
1.5 One circuit per room except where two level switched or more than limits in 1.4.

Preferred parameters in a Client ES are used by the specific project to adjust the rules used by the system in expediting a project, or portion thereof. These parameters are primarily made up of choices made by the client, rather than technical engineering issues. An example of preferred parameters under a Client ES would include:

Project: ABC School
Client: DEF School Board
Location: MetroCity, USA
1.1 Lighting Requirements:
  1.1.1 Lighting Levels:
    1.1.1.1 IES Standards (IES specifies lighting levels for every type of room or space and is widely accepted in the world.)
    1.1.2 Other (if other is chosen a drop down menu of tables and choices will allow the selection of any lighting level for any space, provided it is within code allowed standards).
1.2 Lighting Types:
  1.2.1 Exterior:
    1.2.1.1 Post Top
    1.2.1.2 On building
    1.2.1.3 Landscape
    1.2.1.4 Other (drop down menu of choices not usually or frequency used.)
  1.2.2 Classrooms:
    1.2.2.1 Fluorescent direct recessed T-bar
    1.2.2.2 Fluorescent indirect
    1.2.2.3 Fluorescent direct (surface)
1.3 Lighting Color:
  1.3.1 Cool white Fluorescent
  1.3.2 Warm White Fluorescent
  1.3.3 Daylight
  1.3.4 Other
1.4 Auxiliary Requirements:
  1.4.1 Duplex Receptacles:
    1.4.1.1 Four per classroom
    1.4.1.2 50' on center in halls
    1.4.1.3 Twenty-four feet on center in gym.
    1.4.1.4 Etc.
  1.4.2 Intercom outlets
    1.4.2.1 One per classroom
    1.4.2.2 One per teacher's workstation
    1.4.2.3 Etc.

Note: If 1.4.2.1 were to be selected, a menu would appear that asks if the intercom outlet is at the teacher's desk, or adjacent to the door to the classroom. These types of prompts and clarifications prompt the responses needed for the forms to be completed.

Careful attention is paid to the development and format of the formatted interaction to ensure that the user is able to easily understand the issues and areas where professional judgment and preference may be exercised and that as little of the valuable time of the design professional as possible is used in applying the client's preferences.

One or more Specific ES are provided for each module type and are cross-referenced with and attached to the General ES for that module type.

A simple example of the data which can be provided by the General ES, Default SES and Client ES respectively is demonstrated in the following challenge to calculate and choose locations for lighting in a 10'33 12' office.

In determining the parameters for the lighting of the 10'×12' room, the default choices may be presented as follows:

1 Fluorescent
  b Glare Free
    i Direct Downlight (deep cell parabolic)

The choices based on the needs and wants of the end user. The client may make these choices and selections without consulting the end user, based on experience and for knowledge of the project needs.

The above choices may have resulted from the following choices for the type of lighting:

1. Fluorescent
2. Metal Halide
3. Pot Lights
4. Other (more choices and prompts are offered if this is chosen). Client Chooses #1 "Fluorescent".

Choices are then offered of:
a. Standard fluorescent
b. Glare free
c. Other (more choices and prompts are offered if this is chosen) Client Chooses #b "Glare free".

Choices are then offered as follows:
i. Direct downlight (deep cell parabolic)
ii. Direct downlight (Holophane lenses)
iii. Direct downlight
iv Other (more choices and prompts are offered if this is the choice) Client Chooses #i "Direct Downlight (deep cell parabolic)".

The parameters chosen then were the same as the default stated above as 1(b)(i).

More generally, the data preferred and modified by the client could include:
  General ES) Code
    Minimum 5 footcandles lighting
    Lighting minimum 6'6" above finished floor
    Standard wiring methods (non hazardous)
    Maximum 2 watts per square foot power consumption (assume this is in a jurisdiction where energy use is regulated).
  Default SES) DRF
    Provide 60 FC of lighting
    Use 2'×4' lighting fixtures
    Use F32 T8 lamps
    Use 3000K lamps
    Calculate lighting level using default lighting calculations software.
  Client ES) PRF
    Use fluorescent lighting
    Provide non-glare lighting The system applies the rules and preferred standards and calculates the number of fluorescent tubes to provide 60 footcandles of lighting. In this example, the system calculates that nine F32 T8 lamps are required and searches its rules to decide how to layout the room. Choices available in the rules are four 2'×4' fixtures@2 lamps each, three 2'×4' fixtures@3 lamps each. The rules allow these choices because the SEP for this client allows for 20% variance in the number of lamps in rooms below 200 square feet. The system then calculates specific lighting levels including minimum and maximum levels in all parts of the room and determines the 4.2L 2XX fixtures is an optimal best solution, completing the design of lighting in this 10'×12' office.

The drawing production output process takes the design generated and produces a graphic representation of the building engineering requirements. In the example of the lighting design for a 10'×12' office, the system interacts with the data given (i.e.: 4.2'×4'2L F32 T8 fixtures in the room) and chooses an optimum layout that fits within the T-bar grid. A graphic layout is then generated that represents these choices using a CAD format of the client's choice. The client is not required to interact at all with the CAD output generation in order for the drawings to be produced.

Additional reports can be generated, all of which can be guided by the user. During the process, or separately, the client can specify their preferences or fill out and retrieve forms like specification data sheets which instruct the system what to generate as Default SES or specifications for the project. Additional sources of design information include catalog cuts and the like. The system accesses relevant databases, interacts with the Specific ES data sheet to generate these specifications. A predetermined report data sheet instructs the system what to generate as reports for the project. Further, specialized instructions in drawing plots are provided recognizing that each client or end user has specific line widths, pen sizes and configuration of layers that they require for the plotting of drawings to suit their own drawing standards. The system can have a library of drawing standards to suit major clients. The client can select any of these, or create his own custom file.

What is claimed is:

1. A process for the production of engineering specifications from an architectural drawing comprising the steps of:
  storing architectural assets in an asset database and each asset being associated with at least functional characteristics;
  identifying one or more architectural assets from a raw CAD file of drawing elements, said assets having correspondence to those stored in the asset database;
  retrieving criteria from at least one database which correspond to the functional characteristics of the one or more identified assets;
  applying the criteria to the identified assets for establishing detailed engineering specifications;
  generating detailed drawing elements corresponding to the detailed engineering specifications and writing the detailed engineering specifications and drawing elements to one or more output CAD files.

2. The process of claim 1 further comprising:
  storing compliance criteria and preferred criteria which correspond to the functional characteristics of the one or more identified assets; and
  receiving additional preferred criteria which augments the stored preferred criteria.

3. The process of claim 2 further comprising the steps of:
  applying the additional preferred criteria to the identified assets for establishing detailed engineering specifications; and
  storing the additional preferred criteria in at least one preferred criteria database.

4. The process of claim 3 further comprising the steps of:
  creating two or more preferred criteria databases;
  selecting one or more of the two or more preferred criteria databases; and retrieving preferred criteria from the one or more selected preferred criteria database in which are stored preferred criteria corresponding to one or more of the identified assets; and applying the selected preferred criteria to the identified assets for establishing detailed engineering specifications.

5. The process of claim 1 further comprising:

creating two or more compliance criteria databases each of which stores criteria specific to a different jurisdiction;

selecting one or more of the two or more compliance criteria databases dependent upon the jurisdiction applicable to the raw CAD drawing; and retrieving compliance criteria from the one or more selected preferred criteria database corresponding to one or more of the identified assets; and applying the selected compliance criteria to the identified assets for establishing detailed engineering specifications.

6. A process for the production of engineering specifications from an architectural drawing comprising the steps of:

reading one or more raw CAD files containing at least drawing elements forming one or more architectural assets having at least functional characteristics;

parsing and labeling the one or more assets found within the one or more raw CAD files which have correspondence to labeled assets stored in an architectural assets database;

retrieving compliance criteria from at least one compliance criteria database in which are stored compliance criteria corresponding to the functional characteristics of one or more of the labeled assets;

retrieving preferred criteria from at least one preferred criteria database in which are stored preferred criteria corresponding to the functional characteristics of one or more of the labeled assets;

applying the compliance and preferred criteria to the labeled assets for establishing detailed engineering specifications;

generating detailed drawing elements corresponding to the detailed engineering specifications; and writing at least the generated detailed drawing elements to one or more output CAD files.

7. The process of claim 6 further comprising the step of: writing one or more reports containing detailed engineering specifications.

8. The process of claim 7 wherein the reports include schedules.

9. The process of claim 7 wherein the reports include bills of materials.

10. The process of claim 6 further comprising the step of: receiving additional preferred criteria corresponding to the functional characteristics of one or more of the labeled assets.

11. The process of claim 10 wherein the additional preferred criteria received are for labeled assets for which there are no previously stored preferred criteria.

12. The process of claim 6 further comprising the steps of:

receiving additional preferred criteria corresponding to the functional characteristics of one or more of the labeled assets;

applying the additional preferred criteria to the labeled assets for establishing detailed engineering specifications; and storing the additional preferred criteria in at least one preferred criteria database.

13. The process of claim 12 further comprising the steps of:

creating two or more preferred criteria databases;

selecting one or more of the two or more preferred criteria databases; and retrieving preferred criteria from the one or more selected preferred criteria database in which are stored preferred criteria corresponding to the functional characteristics of one or more of the labeled assets; and applying the selected preferred criteria to the labeled assets for establishing detailed engineering specifications.

14. The process of claim 12 further comprising:

creating two or more compliance criteria databases each of which stores criteria specific to a different jurisdiction;

selecting one or more of the two or more compliance criteria databases dependent upon the jurisdiction applicable to the raw CAD drawing; and retrieving compliance criteria from the one or more selected preferred criteria database corresponding to one or more of the identified assets; and applying the selected compliance criteria to the identified assets for establishing detailed engineering specifications.

15. The process of claim 6 further comprising the step of:

associating each detailed engineering specification with a unique detail identifier; and writing at least the generated detailed drawing elements with their associated unique detail identifiers to the one or more output CAD files.

16. The process of claim 6 wherein at least some of the one or more CAD files contain drawing layers, the process further comprising the steps of:

locating discrete architectural assets in different drawing layers;

retrieving an asset identifier from one of the discrete drawing layers and its coordinates associated therewith; and parsing the architectural assets by locating coordinates of architectural assets in the one or more drawing layers and at coordinates corresponding to the coordinates associated with the asset identifier.

17. The process of claim 16 further comprising the steps of:

determining geometrical characteristics of the asset to which the compliance criteria or preferred criteria apply.

18. The process of claim 17 wherein the geometrical characteristics are at least area and dimensional.

19. The process of claim 6 wherein the CAD file is provided by a known client, the process further comprising the steps of:

maintaining an interactive network system and having at least one client terminal;

downloading the client's raw CAD files from the client's terminal; and uploading detailed output CAD drawings to the client's terminal.

20. The process of claim 19 further comprising the steps of:

maintaining one or more preferred criteria databases for the known client;

implementing a security and authentication process which ensures that the known client's preferred criteria databases are only accessed by the client.

21. The process of claim 20 further comprising the steps:
providing the known client with an interface for specifying additional preferred criteria corresponding to the functional characteristics of one or more of the labeled assets; and
receiving additional preferred criteria;
storing the additional preferred criteria in one or more of the known client's preferred criteria databases.

22. Apparatus for producing engineering specifications from an architectural drawing comprising:
a computer system having at least one client terminal;
means for reading one or more raw CAD files containing at least drawing elements forming one or more architectural assets having at least functional characteristics,
means for parsing and labeling the one or more assets found within the one or more raw CAD files which have correspondence to the functional characteristics of labeled assets stored in an architectural assets database;
means for retrieving compliance criteria from at least one compliance criteria database in which are stored compliance criteria corresponding to the functional characteristics of one or more of the labeled assets;
means for retrieving preferred criteria from at least one preferred criteria database in which are stored preferred criteria corresponding to the functional characteristics of one or more of the labeled assets;
means for applying the compliance and preferred criteria to the labeled assets for establishing detailed engineering specifications;
means for generating detailed drawing elements corresponding to the detailed engineering specifications; and
means for writing at least the generated detailed drawing elements to one or more output CAD files.

23. The apparatus of claim 22 further comprising
an interactive network system and having at least one client terminal; and
a server for storing databases and having means for reading raw CAD files, parsing the raw CAD files, retrieving compliance and preferred criteria, generating detailed drawing elements, and writing detailed drawing elements or output CAD files.

24. Apparatus for producing engineering specifications from an architectural drawing comprising:
a computer system and having at least one client terminal;
one or more databases; and
application program means for
reading and writing CAD files;
for parsing a raw CAD file for one or more architectural assets having at least functional characteristics corresponding to architectural assets stored in a database, and labeling same,
for retrieving compliance criteria and preferred criteria from a database in which are stored criteria corresponding to the functional characteristics of one or more of the labeled assets;
for applying the compliance and preferred criteria to the labeled assets for establishing detailed engineering specifications;
for generating detailed drawing elements corresponding to the detailed engineering specifications and writing to one or more output CAD files.

25. An article of manufacture comprising media embodying detailed engineering specifications overlaid on an architectural drawing, said media being created by a method comprising the steps of:
reading one or more raw CAD files containing at least drawing elements forming one or more architectural assets having at least functional characteristics;
parsing and labeling the one or more assets found within the one or more raw CAD files which have correspondence to the functional characteristics of labeled assets stored in an architectural assets database;
retrieving compliance criteria from at least one compliance criteria database in which are stored compliance criteria corresponding to one or more of the labeled assets;
retrieving preferred criteria from at least one preferred criteria database in which are stored preferred criteria corresponding to one or more of the labeled assets;
applying the compliance and preferred criteria to the labeled assets for establishing detailed engineering specifications;
generating detailed drawing elements corresponding to the detailed engineering specifications; and
writing at least the generated detailed drawing elements to one or more output CAD files on said media.

26. The article of manufacture of claim 25 wherein the media is readable by a computer.

27. An article of manufacture comprising computer readable media embodying instructions executable by a computer for producing detailed engineering specifications from a digital file of an architectural drawing using a method, said method comprising the steps of:
reading one or more raw CAD files containing at least drawing elements forming one or more architectural assets;
parsing and labeling the one or more assets found within the one or more raw CAD files which have correspondence to labeled assets stored in an architectural assets database;
retrieving compliance criteria from at least one compliance criteria database in which are stored compliance criteria corresponding to one or more of the labeled assets;
retrieving preferred criteria from at least one preferred criteria database in which are stored preferred criteria corresponding to one or more of the labeled assets;
applying the compliance and preferred criteria to the labeled assets for establishing detailed engineering specifications;
generating detailed drawing elements corresponding to the detailed engineering specifications; and
writing at least the generated detailed drawing elements to one or more output CAD files.

* * * * *